(12) United States Patent
Massie et al.

(10) Patent No.: US 8,618,961 B1
(45) Date of Patent: Dec. 31, 2013

(54) SAMPLE RATE CONVERSION USING INFINITE IMPULSE RESPONSE FILTERS

(71) Applicants: Dana Massie, Santa Cruz, CA (US); David P. Rossum, Santa Cruz, CA (US); Brian Clark, San Jose, CA (US); Leonardo Rub, Sunnyvale, CA (US); Jean Laroche, Santa Cruz, CA (US)

(72) Inventors: Dana Massie, Santa Cruz, CA (US); David P. Rossum, Santa Cruz, CA (US); Brian Clark, San Jose, CA (US); Leonardo Rub, Sunnyvale, CA (US); Jean Laroche, Santa Cruz, CA (US)

(73) Assignee: Audience, Inc., Mountain View, CA (US)

( * ) Notice: Subject to any disclaimer, the term of this patent is extended or adjusted under 35 U.S.C. 154(b) by 0 days.

(21) Appl. No.: 13/797,344

(22) Filed: Mar. 12, 2013

Related U.S. Application Data

(60) Provisional application No. 61/609,789, filed on Mar. 12, 2012.

(51) Int. Cl.
*H03M 7/00* (2006.01)

(52) U.S. Cl.
USPC ............................................. 341/61; 341/60

(58) Field of Classification Search
USPC ........................ 341/60, 61; 375/346; 455/230
See application file for complete search history.

(56) References Cited

U.S. PATENT DOCUMENTS

| | | | |
|---|---|---|---|
| 6,252,919 B1 * | 6/2001 | Lin .............................. | 375/377 |
| 6,747,858 B1 * | 6/2004 | Sculley et al. .................. | 361/61 |
| 8,369,973 B2 * | 2/2013 | Risbo .............................. | 700/94 |
| 2004/0120361 A1 * | 6/2004 | Yu et al. ........................ | 370/545 |

* cited by examiner

*Primary Examiner* — Brian Young
(74) *Attorney, Agent, or Firm* — Carr & Ferrell LLP

(57) ABSTRACT

Digital methods and systems for signal processing and filtering are provided. The methods and corresponding systems provide asynchronous conversion of sampling rate frequencies and utilize advanced multistage phasor filters for converting an input signal having a first sampling rate into an output signal sampled in an arbitrary sequence of sampling times. The conversion process provides a sequence of sets of complex numbers representing a filtered version of the input signal. More specifically, the conversion process includes the calculation of values of the output signal by multiplying (e.g., scaling) the sets of complex numbers by a corresponding set of complex phasors, the complex phasors corresponding to the timing of the arbitrary time sequence to obtain a corresponding set of real results with the value of the output signal being the sum of the real results.

20 Claims, 34 Drawing Sheets

800

SAMPLE RATE CONVERSION USING INFINITE IMPULSE RESPONSE FILTERS

CROSS REFERENCES TO RELATED APPLICATIONS

This application claims the benefit of U.S. Provisional Patent Application No. 61/609,789, filed Mar. 12, 2012, which is hereby incorporated by reference in its entirety.

TECHNICAL FIELD

The application generally relates to digital signal processing using filters and, more specifically, to the technology for asynchronous sample rate conversion (ASRC) of digital signals using filtering.

BACKGROUND

Conventionally, ASRC is used for converting audio signals from one sample frequency to another, while the information carried by the audio signals is not substantially changed. The input and output sample frequencies can be an arbitrary fraction of one another or the same frequency, but based on different clocking signals. The output signal, generally speaking, is a band-limited version of the input signal resampled to match the output sample timing. Thus, the ASRC finds application in transmitting signals between discrete-time systems having different sampling rates. For example, two different audio systems may use sampling rates of 48 and 96 kHz.

A common technique for sampling rate conversion is to use a combination of up-sampling, filtering and down-sampling. This approach works well if the ratio of sampling rates is a rational number. In many cases, however, the sampling rates are not related by a rational number. This occurs frequently when trying to synchronize audio signals arriving on separate digital networks. For example, a first system may transmit signals at the sampling rate of 44.1 kHz to a second system operating at a frequency slightly less than 44.1 kHz. In fact, the input data rate may be slowly varying, in which case the receiving system will accommodate these variations. In these cases, irrational sampling rate conversion may be needed. However, conventional irrational sampling rate conversion techniques and corresponding digital ASRC filters may be computationally inefficient and may require large memory resources. Moreover, conventional ASRC techniques may have poor unconditional stability when used in time-varying filtering. Some other known ASRC techniques may generate unwanted noise or may affect the quality of transmitted signal. Thus, there is a need to improve the ASRC methods and eliminate known drawbacks.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The aspects of the present disclosure provide for ASRC methods and systems utilizing Infinite Impulse Response (IIR) filtering. Specifically, provided are methods for asynchronous sampling rate converting, which may be implemented by one or more processors, controllers, logic elements, or any other suitable computing devices. An example method may comprise receiving an input signal having a first sampling rate, filtering the input signal with a plurality of input stages of a set of phasor filters at the first sampling rate to generate a plurality of filtered signals, scaling the plurality of filtered signals utilizing a plurality of output stages of the set of phasor filters to generate a plurality of rescaled signals, and summing the plurality of rescaled signals to generate an output signal having a second sampling rate, which differs from the first sampling rate.

In certain embodiments of the present disclosure, the method may further include temporary storing the plurality of filtered signals in a data buffer. The method may further include re-sampling of the plurality of filtered signals. The second sampling rate is associated with an arbitrary sequence of sampling time instances. The plurality of filtered signals may include a set of complex values, and the plurality of rescaled signals may include a set of real values. The method may further include calculating of phasor filter coefficients based at least in part on the second sampling rate. The method may further include encoding of the phasor filter coefficients using one or more log domain operations. The method may further include advancing the phasor filter coefficients utilizing at least one approximating or extrapolating function. The method may further include determining the second sampling rate is lower than the first sampling rate and, based on the determination, re-scaling the phasor filter coefficients so as to dynamically reduce a cut-off frequency of the set of phasor filters.

A system for asynchronous sampling rate converting is also provided. An example system may include a set of phasor filters, each of which has an input stage and an output stage. The input stages may be configured to receive an input signal having a first sampling rate and filter the input signal at the first sampling rate to generate a plurality of filtered signals. The output stages may be configured to scale the plurality of filtered signals in order to generate a plurality of rescaled signals, sum the plurality of rescaled signals to generate an output signal having a second sampling rate, the second sampling rate being different from the first sampling rate.

In various embodiments, the input stage of at least one phasor filter may include a single complex pole filter. One of the input stage phasor filters may include a first order recursive filter. The plurality of filtered signals may include a set of residues generated by the plurality of input stages of the set of phasor filters. The output stages may include at least one phase accumulator. The system may have one or more half band interpolators configured to increase a sampling rate of the output signals. The system may further include one or more half band decimators configured to decrease a sampling rate of the input signals. The system may further include a data buffer configured to temporarily store the plurality of filtered signals. The output stages may be further configured to rescale one or more phasor coefficients used in the filtering of the input signal. The system may further include a processing unit configured to advance phasor filter coefficients utilizing at least one approximating or extrapolating function.

Provided is also a non-transitory processor-readable medium. The medium may have a program executable by at least one processor to perform a method for asynchronous sampling rate converting, of which an example is given above.

Embodiments described herein may be practiced on any device that is configured to receive and/or provide audio such as, but not limited to, personal computers (PCs), tablet computers, phablet computers, mobile devices, cellular phones, phone handsets, headsets, media devices, and systems for teleconferencing applications.

Other example embodiments of the disclosure and aspects will become apparent from the following description taken in conjunction with the following drawings.

BRIEF DESCRIPTION OF THE DRAWINGS

Embodiments are illustrated by way of example and not limitation in the figures of the accompanying drawings, in which like references indicate similar elements.

DETAILED DESCRIPTION

Figure 1:
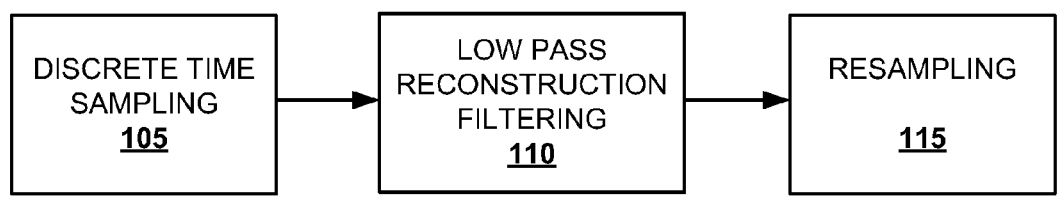
FIG. 1 is a high level block diagram of process for sampling rate conversion.

Various aspects of the subject matter disclosed herein are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspects may be practiced without these specific details. In other instances, well-known structures and devices are shown in block diagram form in order to facilitate describing one or more aspects.

INTRODUCTION

The techniques of the embodiments disclosed herein may be implemented using a variety of technologies. For example, the methods described herein may be implemented in software executing on a computer system or in hardware utilizing either a combination of processors or other specially designed application-specific integrated circuits, programmable logic devices, or various combinations thereof. In particular, the methods described herein may be implemented by a series of processor-executable instructions residing on a non-transitory storage medium such as a disk drive or a processor-readable medium.

In general, various embodiments disclosed herein provide for digital methods for signal processing and/or filtering, which involve asynchronous conversion of sampling rate frequencies. The methods may utilize advanced multistage phasor filters for converting an input signal having a first sampling rate into an output signal sampled at an arbitrary sequence of sampling times. The conversion process may provide a sequence of sets of complex numbers representing a filtered version of the input signal. More specifically, the conversion process may include calculation of values of the output signal by multiplying the sets of complex numbers by a corresponding set of complex phasors corresponding to the timing of the arbitrary time sequence so as to obtain a corresponding set of real results, while the value of the output signal is the sum of the real results. Below is given a detailed description of various aspects and embodiments of the present disclosure with reference to the accompanying drawings.

Sample Rate Conversion Basics

Various embodiments of the sample rate conversion, as described herein, utilize IIR filters, which are one of two primary types of digital filters used in digital signal processing. In exemplary embodiments, IIR filters are more efficient than Finite Impulse Response (FIR) filters, because IIR filters, in contrast to FIR, use feedback which enables using less memory and computational resources. The feedback is provided by the use of an impulse response function, which is a type of difference equation defining how the output is related to the input signal.

A useful method to understand the technique of IIR asynchronous or fractional sample rate conversion is to consider a one-pole filter with a real coefficient. A classic model for IIR fractional sample rate conversion is the "analog" interpretation, shown in FIG. 1. This figure shows a high level block diagram of process 100 for sampling rate conversion. The process includes an operation 105, when a signal is sampled at a first sampling rate (i.e., the signal is sampled every discrete time period value). At operation 110, the sampled signal is subjected to a low pass reconstruction filtering, and at operation 115, the signal is resampled and output for further processing.

Figure 2:
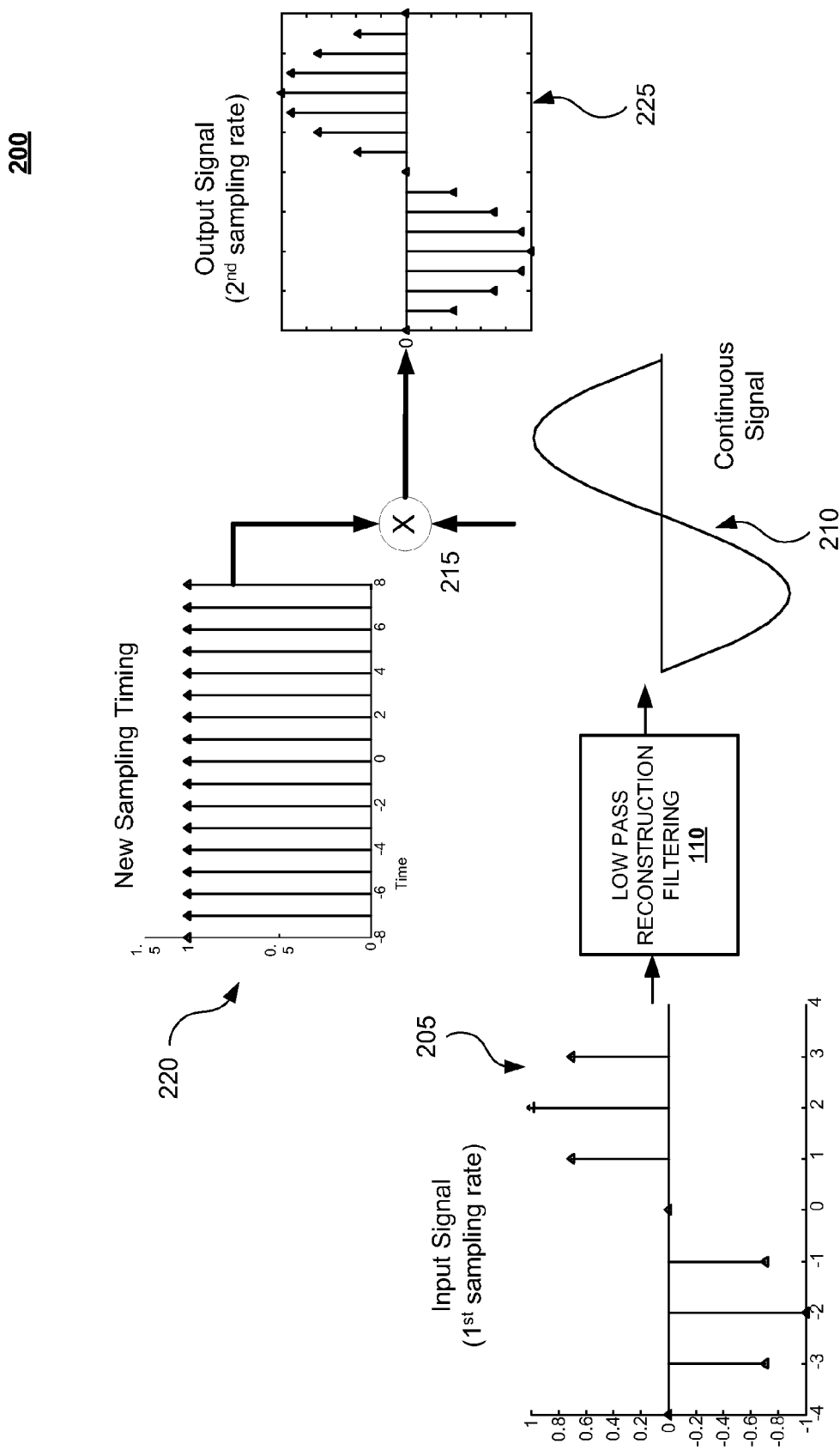
FIG. 2 is an illustration of process of sampling rate conversion.

This process is further illustrated in FIG. 2, which shows a high level block diagram of process 200 for sampling rate conversion, according to one or more embodiments. The input signal is represented as a pulsed signal 205 having a first sampling rate. The low pass reconstruction filter of operation 110 is then applied to the pulsed signal 205 to generate a filtered continuous signal 210. The filtered continuous signal 210 is then multiplied in the multiplier 215 by a pulsed timing/synch signal 220. The output of the multiplier 215 is a multiplied output signal 225 having a second sampling rate, which differs from the first sampling rate. As shown in FIG. 2, the sampling frequency is higher for the output signal than for the input signal.

The analog filter model shown in FIGS. 1 and 2 is equivalent to a digital filter with an infinite sampling rate. However, only those values of the analog filter impulse response at required output time may be computed. The digital filtering may rely on the following equations:

A discrete time signal may be represented as $$\hat{x}(t) = \sum_{k=-\infty}^{\infty} x(kT)\delta(t-kT) \quad \text{(Eq. 1)}$$

where $\delta(\ )$ represents the Dirac delta function, $x(kT)$ represents the continuous time signal, and $\hat{x}(t)$ represents the sampled time signal, and $T=1/Fs$, (where T represents the time between samples and Fs is the sample rate.)

The resampling operation may be performed by convolution with the sampled signal $x(t)$ and the filter $g(t)$:

$$\hat{x}(t) = \sum_{k=-\infty}^{\infty} x(kT)g(t-kT) \quad \text{(Eq. 2)}$$

Figure 3:
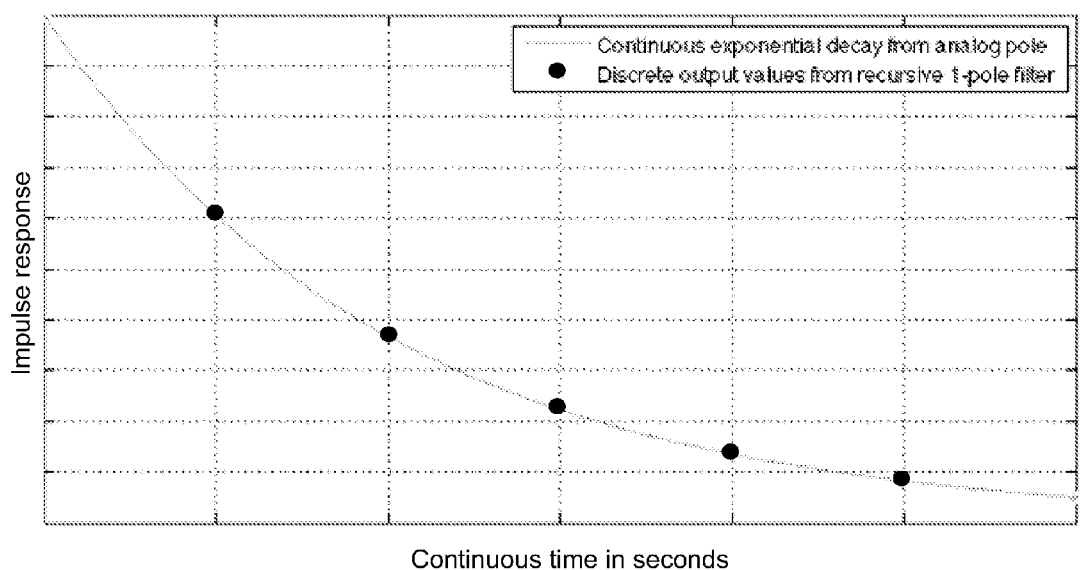
FIG. 3 is an example plot with overlay of digital and analog responses of one-pole filter.

The consideration of this filtering and resampling process may be started with a one pole analog filter with an impulse response $g(t)$. FIG. 3 illustrates an example plot 300 with the overlay of digital and analog responses of a one-pole filter. The dots represent discrete output values obtained from a digital recursive one-pole filter, while the line represents a continuous exponential decay obtained from an analog filter. One skilled in the art should understand that values of impulse filter response may be calculated at fractional time instances. In addition, as should be understood, the impulse response of the simple one-pole real filter may be computed recursively, or it may be calculated as an exponential function using a closed form evaluation as will be described below.

Partial Fraction Expansion for Digital IIR Filter

The analog filter rational transfer function G(S) may be factored using a partial fraction expansion as:

$$G(S) = k + \sum_{n=1}^{Np} \frac{r_n}{s - s_n} \quad \text{(Eq. 3)}$$

where $\{s_n\}$ is a set of Np s-plane poles, $\{r_n\}$ is the set of Np residues obtained from the partial fraction expansion, and Np is a filter order. Note, $k \neq 0$, if the number of poles and zeros are equal.

A non-zero k may be avoided by making the number of zeros at least one less than the number of poles. In general, the phasor IIR filter of the ASRC method may assume that k=0 so that the path, where k scales the input signal, is absent. A non-zero k may complicate the IIR ASRC technique, and this coefficient may not be needed for a proper conversion process. To avoid this situation, the example analog filter method may have an order of the numerator one less than the denominator. It is important to note that for exact integer sample rate conversion ratios, it may be simpler to include the k path allowing more general filter design methods for the example filter.

Figure 4:
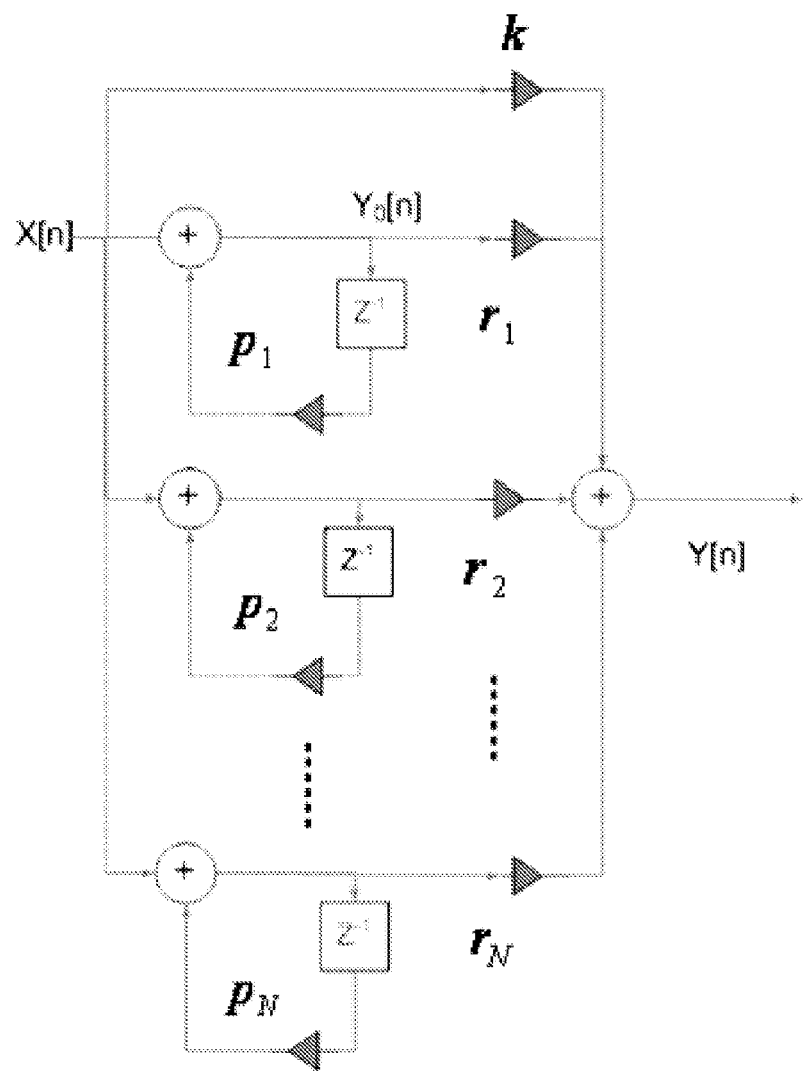
FIG. 4 is a high level block diagram of an IIR ASRC filter having a partial fraction expansion.

FIG. 4 shows a high level block diagram of IIR ASRC filter 400 having a partial fraction expansion, according to one or more embodiments of the present disclosure.

As shown in the figure, the filter includes a multiple stage structure, where an input signal X[n] is summed with a plurality of signals generated by feedback paths. The feedback paths include $Z^{-1}$ blocks, which are essentially delay units, the output of each being weighted with respective pole coefficients $P_n$ using corresponding multiplicators. Pole coefficients $P_n$ will be complex numbers according to various embodiments. The summed signals, as shown in FIG. 4, are then weighted with residues $r_n$, which generally may be complex values. The weighted summed signals are then combined to generate a result output Y[n]. The IIR ASRC filter 400 may be illustrated in mathematical terms as follows.

The impulse response of the IIR ASRC filter 400 may be given by the following equation:

$$g(t) = \sum_{n=1}^{Np} r_n e^{s_n t}, t \geq 0 \quad \text{(Eq. 4)}$$

Eq. 2 may be rewritten as $$\hat{x}(t) = \sum_{k=-\infty}^{\infty} x(kT)g(t-kT) \quad \text{(Eq. 5, portion same as Eq. 2)}$$

and $$\hat{x}(t) = \sum_{k=-\infty}^{\infty} x(kT) \sum_{n=1}^{Np} r_n e^{s_n t - kT} \quad \text{(Eq. 6)}$$

Further, the output time instance may be rewritten as a phase accumulator t:

$$t = \rho T + \Delta t \quad \text{(Eq. 7)}$$

where $$T = \frac{1}{Fs},$$

and Fs is the input sample rate;

$$\rho T = \text{floor}\left(\frac{t}{T}\right),$$

where ρ is an integer value of output sample time index; and $$\Delta t = \text{fraction}\left(\frac{t}{T}\right) = t - \rho T,$$

is a fractional value of the output sample time index.

Substituting the latter equations and changing the order of summation may provide:

$$\hat{x}(\rho T + \Delta t) = \sum_{n=1}^{Np} r_n e^{s_n \Delta t} \sum_{k=-\infty}^{\rho} x(kT) e^{s_n(\rho-k)T} \quad \text{(Eq. 8)}$$

The last summation represents a convolution of the input sequence with the IIR filter, whose impulse response may be given as:

$$h_n(k) = e^{s_n T k} \quad \text{(Eq. 9)}$$

which is therefore a pole at:

$$P_n = e^{s_n T} = e^{real(s_n T)} \cdot (\cos(\text{imag}(s_n T) + i \cdot \sin(\text{imag}(s_n T)) \quad \text{(Eq. 10)}$$

The first summation scales the state variable of the filter by $$r_n e^{s_n \Delta t} = r_n P_n^{\Delta t} \quad \text{(Eq. 11)}$$

where $P_n^{\Delta t}$ may be calculated for every output sample and for each value of $\Delta t$.

Complex Phasor Filters

Figure 5:
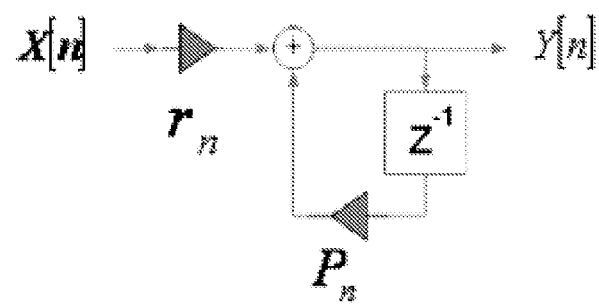
FIG. 5 is an example high level block diagram of a first order recursive filter.

According to one or more embodiments of the present disclosure, the poles $\{P_n\}$ of the IIR filter may be implemented as a first order recursive filter. An example high level block diagram of first order recursive filter 500 is illustrated in FIG. 5. Those skilled in the art should understand that the residue scale factors $\{r_n\}$ may be applied in the first order recursive filter 500 either before or after the summing operation using poles.

Figure 6:
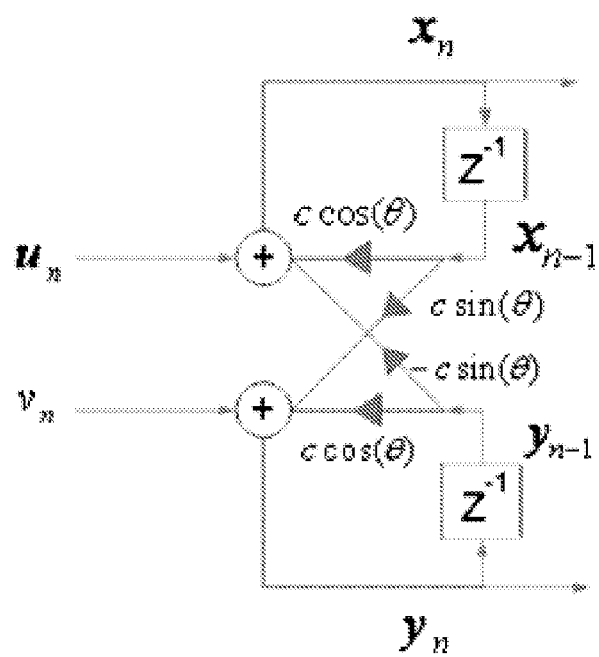
FIG. 6 is an example high level block diagram of a single complex resonator that utilizes real arithmetic operation only.

FIG. 6 shows an example high level block diagram of a single complex resonator 600 (also referred to herein as a "phasor filter") that utilizes real arithmetic operation only. In this example, an input of the complex resonator 600 includes a complex number $\{u_n, v_n\}$. The input signal can also be real only, in which case the values $v_n$ will be zero. As shown in the figure, in operation, a 2-element vector $$\hat{X}_n = \begin{bmatrix} x_n \\ iy_n \end{bmatrix}$$

is multiplied by a complex number $c(\cos(\theta) + i \cdot \sin(\theta))$, where:

$$x_n = c \cos(\theta) x_{n-1} - c \sin(\theta) * y_{n-1} + u_n$$

$$y_n = c \sin(\theta) x_{n-1} + c \cos(\theta) * y_{n-1} + v_n \quad \text{(Eq. 12)}$$

which may be interpreted as a rotation and scaling of the vector $$\hat{X}_n = \begin{bmatrix} x_n \\ y_n \end{bmatrix}.$$

Figure 7:
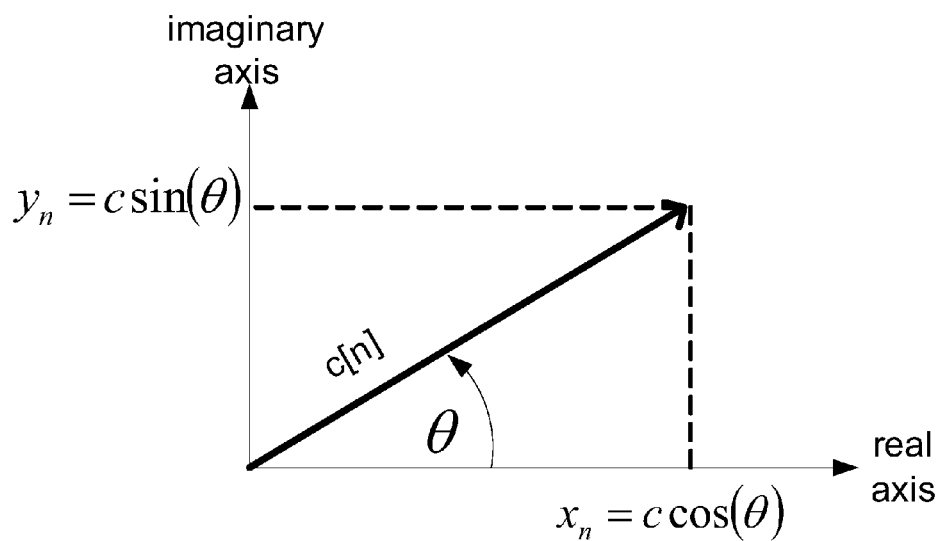
FIG. 7 is an example phasor filter vector representation.

The vector $$\hat{X}_n = \begin{bmatrix} x_n \\ y_n \end{bmatrix}$$

is illustrated in the example phasor filter vector representation 700 in FIG. 7.

The vector $\hat{X}_n$ is also known as the "state" of the phasor filter 600. The parameter θ controls the resonant frequency of the phasor filter 600. The magnitude of the pole position may be controlled by the magnitude parameter c, which must be less than or equal to 1 so that the phasor filter is stable according to various embodiments. The magnitude parameter may control the decay time of the phasor filter 600.

According to an embodiment, the phasor filter 600 may be presented in a source code as follows (for this example, the input signal is assumed to be real only, and thus, the imaginary $v_n$ values are assumed to be zero):

c Cos [zi]=c *cos(theta);

c Sin [zi]=c*sin(theta);

y2[zi]=(c Cos [zi]*y1[zi])−(c Sin [zi]*(z1[zi]−u[n]));

z2[zi]=(c Sin [zi]*y1[zi])+(c Cos [zi]*z1[zi]);

z1[zi]=z2[zi];

y1[zi]=y2[zi];

outReal[zi]=y1[zi];

outImag[zi]=z1[zi];

According to one or more embodiments, such a complex one-pole recursive (phasor) filter topology as shown and described above may be utilized for each of the factored poles of the complex phasor filter 600, e.g., also referred to herein as IIR ASRC filter 600. One skilled in the art will appreciate at least the following benefits of using the complex phasor filter 600 in the IIR ASRC process compared to various other IIR filtering techniques:

a) The complex phasor filter 600 may have generally low quantization noise gain, which allows the use of a smaller multiply precision for the same signal-to-noise rate (SNR) values compared to conventionally used direct form filters.

b) The complex phasor filter 600 may have unconditional stability when coefficients are time varying.

c) The complex phasor filter 600 may not exhibit transients when coefficients are changed.

d) The quantization of coefficients in the phasor filter 600 may yield a denser grid of pole locations at low frequencies, which may allow better frequency resolution for cutoff frequency at low frequencies.

Optimized Phasor Form

Figure 8:
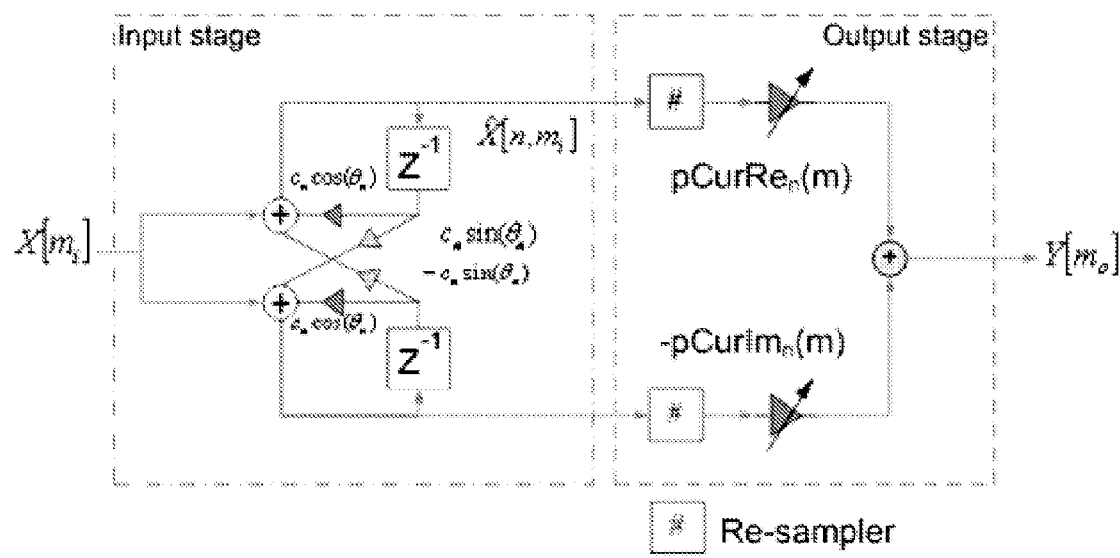
FIG. 8 is a high level block diagram of an optimized single complex pole IIR ASRC filter section including the output stage time varying coefficients.

FIG. 8 shows a high level block diagram of an optimized single complex pole IIR ASRC filter section 800 including the output stage time varying coefficients. (The input X[mi] is shown in FIG. 8 as splitting into two paths, the real portion of X[mi] being input (upper path after split) to the real input of the phasor filter, and the imaginary portion of X[mi] being input (lower path after split) to the imaginary input of the phasor filter. If the input X[mi] is assumed to be real only, the imaginary input value is assumed to be zero) This structure may require six real multiplications, two of which may be time varying (as shown in this figure). To make the filter section 800 for the IIR ASRC filtering practical, the optimization may involve the following.

First, complex conjugate poles may be discarded. The order Np of the prototype filter G(S) may be odd in general, which means that there is one real pole and Np−1 complex poles. Further, half of the complex poles may be discarded, leaving ((Np−1))/2 complex poles. For each discarded complex pole $P_n$, a corresponding complex residue $r_n$ will be discarded. The remaining complex poles must be scaled by 2 to obtain the correct filter response. In an example embodiment, the filter section 800 may use pre-scaling of each remaining complex residue $\{r_n\}$ by 2, when the residues $\{r+\}$ are generated.

Figure 9:
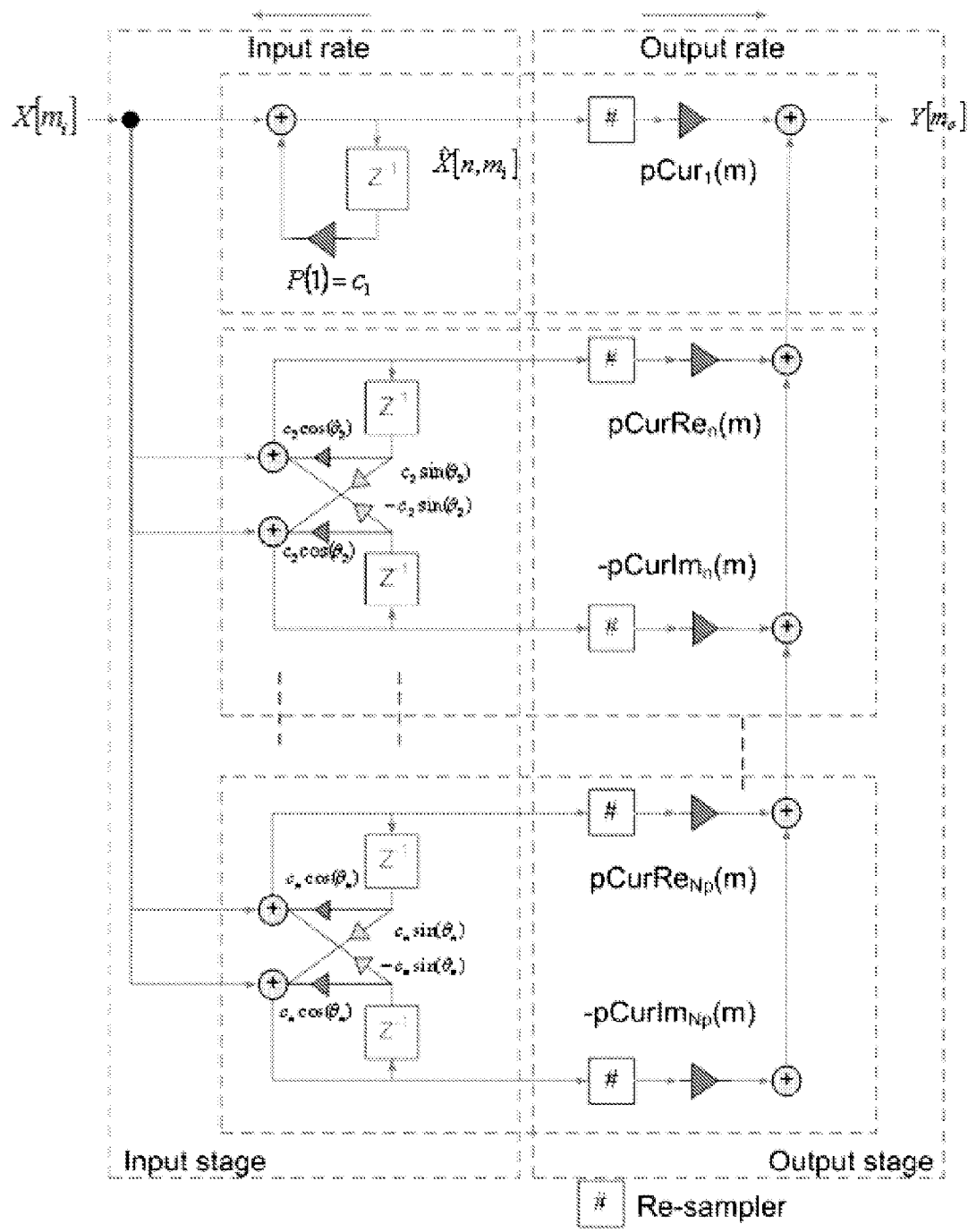
FIG. 9 is a high level diagram of an example IIR ASRC real phasor filter.

In addition to above, when the input and output signals are real, the residue multiplication may be simplified, which may save some computation resources by reducing a million instruction per second (MIPS) value by moving the residue multiplies to the front of the pole calculations as shown in FIG. 9. More specifically, FIG. 9 illustrates a high level diagram of an example IIR ASRC real phasor filter 900, which combines a plurality of complex pole IIR ASRC filter sections 800.

Further, a coefficient phasor advance method may be used, which is described below in greater detail. Specifically, the residues may be combined with the output time varying pole coefficients pCur, which are shown in FIG. 8 and defined as follows (for $0 \leq \Delta t \leq 1.0$):

$$p_n = c_n(\cos(\theta_n) + i \cdot \sin(\theta_n)) \tag{Eq. 13}$$

$$PCur_n^{\Delta t} = c_n^{\Delta t}(\cos(\theta_n \cdot \Delta t) + i \cdot \sin(\theta_n \cdot \Delta t)) \tag{Eq. 14}$$

In addition to above, when the output signal is real, the output pole coefficient complex multiplication may be further simplified by discarding one half of the complex multiplication. Those skilled in the art will appreciate that some computational resources savings may be achieved from combining complex conjugate terms into real second order sections, which may lead to the use of only one multiplying process per section 800, when the optimizations described herein are used to make the complex phasor filter practical.

With continuing reference to FIG. 9, there is illustrated the IIR ASRC real phasor filter 900, which has an input stage and output stage. The filter 900, in operation, may use the algorithm with decomposed arithmetic to explicitly reveal the real number arithmetic operations implied by the complex arithmetic. The output stage of the filter 900 multiplies a complex number P times complex number b; however, in cases where only a real output signal is desired, then one half of the real multiplies may be discarded. A full complex multiply can be given as follows:

$$P * b = P_{real} + i \cdot P_{imag} = \tag{Eq. 15}$$
$$P_{real} \cdot b_{real} - P_{imag} \cdot b_{imag} + i \cdot (P_{real} \cdot b_{imag} + b_{real} \cdot P_{imag})$$

Preserving only the real output may require the calculation of:

$$P_{real} \cdot b_{real} - P_{imag} \cdot b_{imag} \tag{Eq. 16}$$

which may avoid the calculation of:

$$i \cdot (P_{real} \cdot b_{imag} + P_{real} \cdot b_{imag}) \tag{Eq. 17}$$

The residues rSubN are complex values except for one real valued residue. For cases where the input signal x is real, the calculation may be simplified to:

$$r_{real} \cdot x_{real} - r_{imag} \cdot x_{imag} \tag{Eq. 18}$$

This may be one half of the work of a complex value times a complex value. In FIG. 9, the residues are not shown, because later, an exemplary embodiment is described that allows the residues to be commuted to the output pCur multiplications, saving two multiplies per pole.

Time Varying Stability of Phasor Filters

An overview of a proof of sufficient criterion for time varying stability is provided below. In general, for a time varying filter, a FIR part of the filter may not contribute to instability. FIR filters are unconditionally stable. Thus, treatments of time varying recursive filter stability may simply analyze the homogeneous part of the state variable equation (the recursive part only). It is sufficient to understand the impulse response of the recursive part of the state variable description to determine if the filter is stable under variation of the coefficients. Assume:

$$\hat{x} = A\hat{x}_{n-1} \tag{Eq. 19}$$

$$\begin{bmatrix} x_1 \\ x_2 \end{bmatrix}_n = \begin{bmatrix} a_{11} & a_{12} \\ a_{21} & a_{22} \end{bmatrix} \cdot \begin{bmatrix} x_1 \\ x_2 \end{bmatrix}_{n-1} \tag{Eq. 20}$$

A simple example of an unstable second order time-varying filter may include:

$$y(n) = (-1)^\wedge(n-1) * y(n-1) - 0.25 * y(n-2) + x(n) \tag{Eq. 21}$$

This 2-pole filter may have a repeated real pole at either −0.5 or 0.5, which are, of course, well away from the unit circle, and each pole by itself is certainly stable in a time-invariant filter. This filter may be described by two sets of filter coefficients:

$$p1 = [1\ 1\ 0.25]$$

$$p2 = [1\ -1\ 0.25]$$

In turn, this implies two different A matrices in the state variable description of this time varying filter, A1 and A2:

$$A_1 = \begin{bmatrix} -1 & -0.25 \\ 1 & 0 \end{bmatrix}, A_2 = \begin{bmatrix} 1 & -0.25 \\ 1 & 0 \end{bmatrix} \tag{Eq. 22}$$

To find out what happens as time evolves for this time varying recursion, there may be explicitly solved for the output value after two time steps:

$$\hat{x}_n = A_n \hat{x}_{n-1}$$

$$\hat{x}_1 = A_1 \hat{x}_0$$

$$\hat{x}_2 = A_2 \hat{x}_1 = A_2 A_1 \hat{x}_0 \tag{Eq. 23}$$

The product of the two different A matrices, i.e., $A_2 A_1$, produces a matrix whose eigenvalues are greater than one (which produces an unstable filter):

$$A_1 A_2 = \begin{bmatrix} -1.25 & -0.25 \\ 1 & -0.25 \end{bmatrix} \tag{Eq. 24}$$

$$eig(A2 * A1) = [-1.4571\ -0.0429]$$

Figure 10:
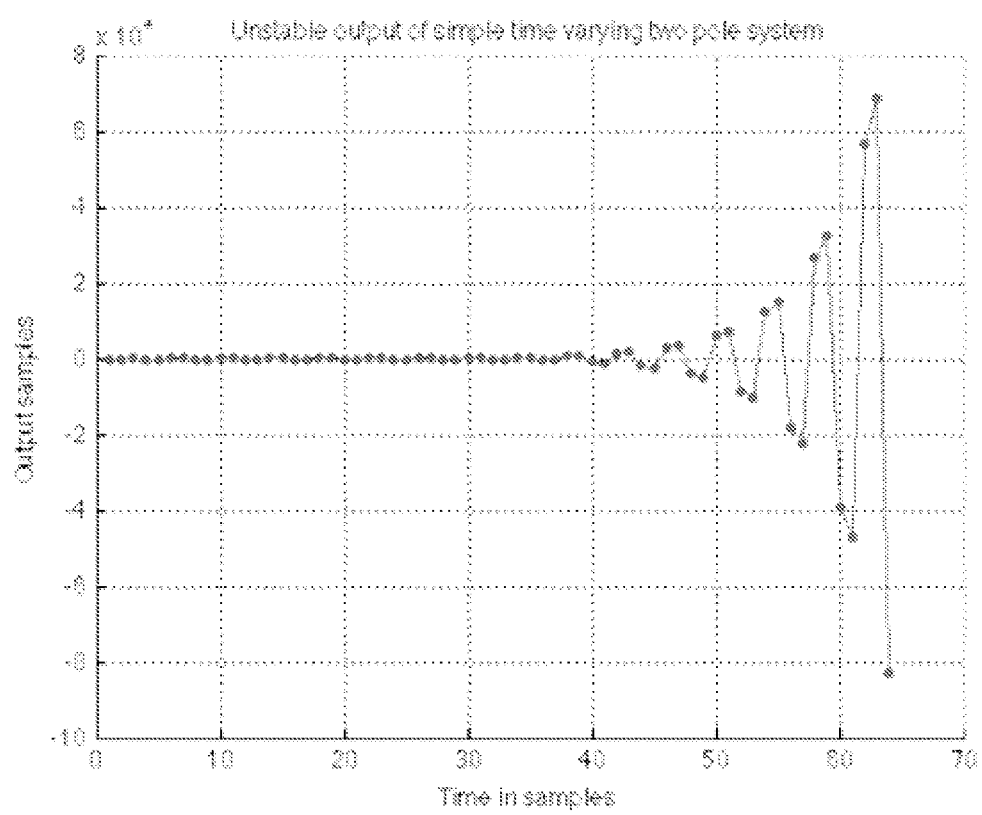
FIG. 10 is an example plot showing the impulse response of the filter, which is clearly becoming unbounded or unstable in a small number of samples.

FIG. 10 shows an example plot 1000 showing the impulse response of the unstable filter in accordance with Eq. 21 above, which is clearly becoming unbounded or unstable in a small number of samples. For this simple case of the filter according to Eq. 21 described by only two sets of coefficients, which repeat, it is easy to calculate the product of the two resulting A matrices, which in turn may immediately reveal that the filter is diverged. For more complex cases, where the filter coefficients may vary in an arbitrary way over time, it may be desirable to have a filter structure which is unconditionally stable regardless of what parameters are used.

The condition is that, given an impulse input signal, the length of the filter state vector $\|\hat{x}_n\| = (\sqrt{x_1^2 + x_2^2})_n$ cannot increase.

The condition is satisfied, if the matrix norm of A is less than one. The matrix norm of a matrix is the maximum amplification possible for a unit norm vector x by matrix A:

$$y = Ax \quad \text{(Eq. 25)}$$

The matrix norm may be calculated by taking the largest singular value of the matrix A1 (or A2):

$$A_1 = \begin{bmatrix} -1 & -0.25 \\ 1 & 0 \end{bmatrix}, A_2 = \begin{bmatrix} 1 & -0.25 \\ 1 & 0 \end{bmatrix} \quad \text{(Eq. 26)}$$

The matrix norm for the example given in Eq. 21 may be defined as $$\text{norm}(A1) = \text{norm}(A2) \approx 1.4254 \quad \text{(Eq. 27)}$$

This implies that the state vector $\|\hat{X}\|$ length can increase. This condition may be sufficient, but certainly not necessary, for stability, because every direct form filter has a matrix norm for its A matrix, which is greater than one, even when the filter is stable in the time-invariant sense.

Figure 11:
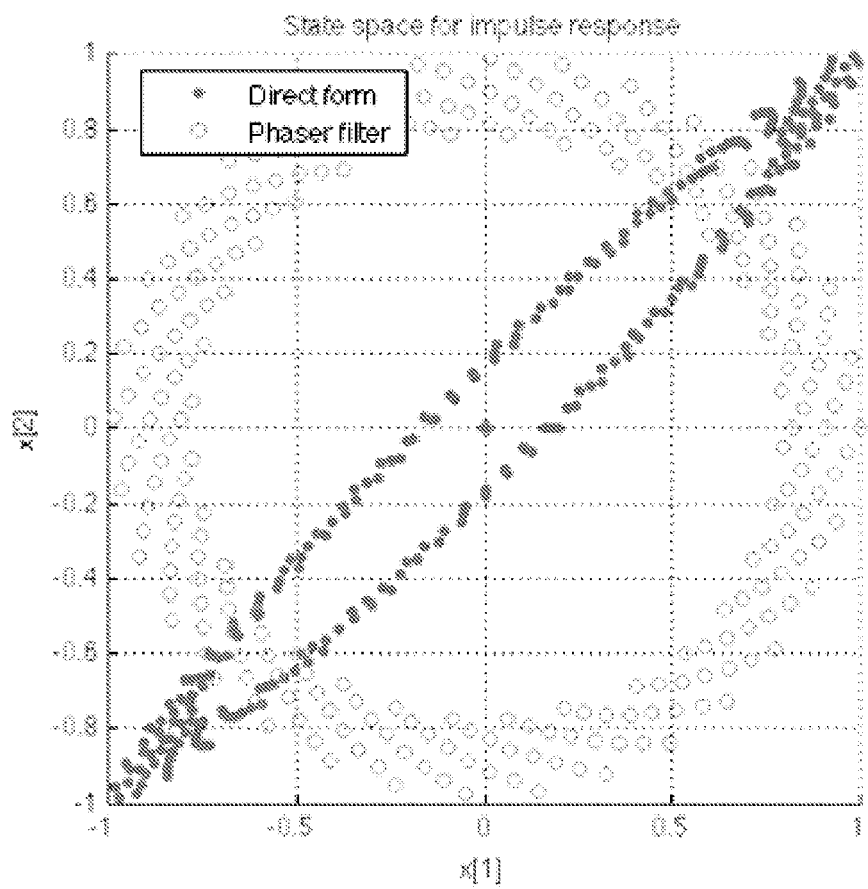
FIG. 11 is an example state space plot of an impulse response of a direct form second order filter overlaid with a state space plot for phasor filter with the same parameters for radius of pole pair r and pole angle θ.

FIG. 11 shows an example state space plot 1100 of the impulse response of a direct form second order filter overlaid with a state space plot for phasor filter with the same parameters for radius of pole pair r and pole angle θ. The direct form filter gain is normalized so that the impulse response maximum is approximately unity.

The shape of the state space for the direct form may be seen to be highly elliptical in this example, while the phasor filter state space may be almost circular. This eccentricity is responsible for the undesirable time domain behavior of the direct form filter. It is also the cause of many of the poor numerical behaviors (e.g., high noise gain) of the direct form filter. The state variables of a direct form filter may be correlated, and as the poles get closer to the unit circle or to each other, then eccentricity gets worse (the ellipse gets narrower and narrower). This implies that the state variables may be even more correlated, which results in a "catastrophic cancellation" process.

The state vector in a direct form filter increases in length, but it also decreases in length, which is why direct form filters may be stable. If the state vector only increased in length, then all direct form filters would always become unstable. The coefficients in an asynchronous sample rate converter in many practical applications may change very often, even thousands of times per second. Time varying stability is therefore an important and practical issue.

The feedback matrix A for all phasor filters may be always less than 1.0 as long as the magnitudes of the coefficients are less than 1.0. Therefore, the phasor filters may be unconditionally stable with time varying coefficients. The same condition also ensures that that there are no transients when the coefficients are updated. It should be also noted that the filter 900 is probably the least expensive filter (of order >1) that may satisfy this stability constraint.

Calculating Phase Accumulator Values

The variable time used in the filter 900 may be defined as tInc, which is the ratio of input sampling rate to the output sampling rate:

$$tInc = \frac{InputSampleRate}{OutputSampleRate} \quad \text{(Eq. 28)}$$

For example, tInc=2.0 implies that the Input sampling rate is half of the Output sampling rate (i.e., this is Interpolation). The value of tInc=¼ implies that the Input sampling rate is 4 times the Output sampling rate (i.e., this is Decimation).

The filter 900 may maintain two phase accumulators in one or more exemplary embodiments. One phase accumulator may be denoted as DeltaT, which represents the fractional value of a current output time instance. The other phase accumulator may be denoted as indexY, which is the current integer value of an output time instance. The following source code extract represents the relation between the phase accumulators:

DeltaT=DeltaT+tIncFrac;

DeltaTFrac=DeltaT−floor(DeltaT); % Fraction part of DeltaT fracCarry=DeltaT−DeltaTFrac; % Integer part of DeltaT indexY=indexY+fracCarry+tIncInt;

DeltaT=DeltaTFrac;

Reducing Filter Cutoff Frequency at Run-Time

When the output sampling rate is lower than the input sampling rate, the present technology may provide for re-scaling of the recursive poles to reduce the cutoff frequency of the filter 900 to avoid aliasing. Various embodiments of the present technology include the technique for re-scaling pre-computed filter coefficients at run time, when the output sample rate may decrease to a predetermined value lower than the input sampling rate. This technique is explained further in mathematical terms as follows:

The output sampling rate is lower than the input sampling rate, if the value of tInc is greater than one. A scale factor Fsf may be defined, when tInc >1 as follows:

```
% Fsf = frequency Scale Factor
% Rescale poles for the cases where output is decimated
if tInc > 1
    Fsf = 1/tInc;
else
    Fsf=1;
End
```

The pole coefficients may be calculated from the pre-computed analog pole coefficients using the following method, when Fsf changes (i.e., when tInc changes):

$$ps_n = e^{-iTs_n} = \text{Pre-computed analog filter pole coefficients} \quad \text{(Eq. 29)}$$

where $$= \frac{1}{F_s},$$

and $s_n$ are the analog pole values.

To reduce the cutoff frequency of the filter poles, the pre-computed poles psn may be exponentiated by 1/Fsf as follows:

$$pFixed_n = ps_n^{\frac{1}{Fsf}} \qquad \text{(Eq. 30)}$$

The pre-computed residues are scaled by Fsf:

$$rFixed_n = rs1 * Fsf = \text{scaled residue coefficients} \qquad \text{(Eq. 31)}$$

where rs are pre-computed residue coefficients.

According to one or more embodiments, efficient encoding for the pole values, e.g., to make the run-time exponentiation inexpensive to compute, may be to store the magnitude of the poles in log form. The angles of the poles may be pre-computed and stored and used as inputs to sine and cosine functions:

$$\text{Log } 2\text{Mag}P = \log 2(P_n) \qquad \text{(Eq. 32)}$$

$$pFixed = \text{pow2}(\text{Log } 2\text{Mag}P * Fsf) * (\cos(\theta_n) + i * \sin(\theta_2)) \qquad \text{(Eq. 33)}$$

The pow2, sine, and cosine functions may be computed using a number of methods including piecewise polynomial approximations, Newton-Raphson iteration, or other methods.

Below is given an example MATLAB code illustrating an embodiment for the filter coefficient determination:

```
% Filter coefficients can be pre-calculated once for a given desired
% quality specification.
Apass = 0.01;          % Passband Ripple (dB)
Astop = 130;           % Stopband Attenuation (dB)
FilterOrder =15;
% ps == s-plane poles
[zs,ps,ks]= ellipap(FilterOrder,Apass,Astop);
[bs, as] = zp2tf(zs,ps,ks);
[rs0, ps0, ks0] = residue(bs, as);
% Residues get scaled by Fsf at run-time to lower cutoff frequency
rFixed = rs1 .* Fsf;
pCur = pCur .* rFixed.';
% pFixed = ComplexExponential( Log2MagP, thetaP, Fsf );
Log2MagP_Fsf = Log2MagP * Fsf;
thetaP_Fsf = thetaP * Fsf;
% Inverse of pole coefficients pInv can be calculated when tInc
% changes.
% Compute SIN & COS once, then use CONJUGATE to calculate
% pInv.
% Share SIN & COS with calculation of pFixed poles coefficients.
pCos = cos(thetaP_Fsf);
pSin = sin(thetaP_Fsf);
pInvMag = (2 .^ (-Log2MagP_Fsf));
pFixed =(2 . (Log2MagP_Fsf)) .* (pCos + i*pSin);
pInv = pInvMag .* (pCos − i*pSin);
```

Coefficient Phasor Advance Calculation

According to one or more embodiments of the present disclosure, the output coefficients may be calculated in a number of ways. The fundamental computation pCur=$P^{\Delta T}$ is the exponentiation of a complex number by a real number. Using Euler's identity, this may be rewritten as follows:

$$P^{\Delta T} = c^{\Delta T}(\cos(\theta \cdot \Delta T) + i \cdot \sin(\theta \cdot \Delta T)) \qquad \text{(Eq. 34)}$$

This calculation may be performed in a number of ways including, for example, using piece-wise polynomial approximations for $c^{\Delta T}$ and for cosine and sine functions. However, it is also possible to calculate successive values for $P^{\Delta T}$ by rotating the phasor using appropriate phasor advance and phasor reset scale factors. This complex multiplication may be more efficient on most hardware platforms than a complex exponentiation operation.

An additional benefit of the complex coefficient phasor advance may be the opportunity to move the multiplication of the residues to the output stage of the MaxSRC method, where they can be absorbed into the output stage multiplications by $P^{\Delta T}$.

The ratio of successive values of $P^{\Delta T}$ has a simple pattern, when tInc does not change:

$$\frac{P^{\Delta T1}}{P^{\Delta T2}} = P^{\Delta T_2 - \Delta T_1} \qquad \text{(Eq. 35)}$$

The quantity $\Delta T_2 - \Delta T_1$ has two distinct values, which are frac(tInc) (which means the fractional part of tInc) or frac(tInc)−1; where frac(tInc) may be denoted as tIncFrac, and $\Delta T$ as DeltaT.

Since the ratio of successive values of $P^{\Delta T}$ has only two values for a given pole P and tInc, successive values may be computed by a simple complex multiplication of the current value of P denoted pCur by a complex number pAdv. pAdv may take on one of two values: pAdvUp or pAdvDown. An example method for computing these factors may include:

$$pAdvDown = P^{tIncFrac}$$

$$pAdvUp = P^{(tIncFrac-1)} = P^{tIncFrac} * P^{-1} \qquad \text{(Eq. 36)}$$

The inverse of the pole coefficient is denoted as $$pInv = P^{-1} = \frac{1}{P},$$

which is pre-calculated from $P^{Fsf}$. Further, pInv only needs to be calculated when Fsf changes.

$$pAdvUp = pAdvDown * pInv \qquad \text{(Eq. 37)}$$

The inverse of a complex number is:

$$P^{-1} = r^{-1}(\cos(-\theta) + i \cdot \sin(-\theta)) \qquad \text{(Eq. 38)}$$

$$= r^{-1}(\cos(\theta) - i \cdot \sin(\theta)) = \frac{\text{conjugate}(P)}{|P|}$$

$$= \frac{\text{conjugate}(P)}{mag(P)}$$

The calculation of pInv may share calculations from the calculation of the pole coefficients $P_n$ generated when Fsf changes.

An example source code methodology for selecting a value to use for the coefficient phasor advance may include:

```
% Wrap subphase each time incrementing indexY.
% Detect carry from fraction integrator first.
DeltaT = DeltaT + tIncFrac;
DeltaTFrac = DeltaT − floor(DeltaT);       % Fraction part of DeltaT
```

-continued

```
fracCarry = floor(DeltaT);          % Integer part of DeltaT
indexY = indexY + fracCarry + tIncInt;
DeltaT = DeltaTFrac;
if fracCarry == 0
    pAdv         = pAdvDown;
else
    pAdv         = pAdvUp;
end
```

For each output sample, the output coefficient $P^{\Delta T}$ is calculated by a complex multiplication of the complex value pCur by pAdv:

$$pCur = pCur \cdot pAdv; \% \text{ coefficient phasor advance}$$

Figure 12:
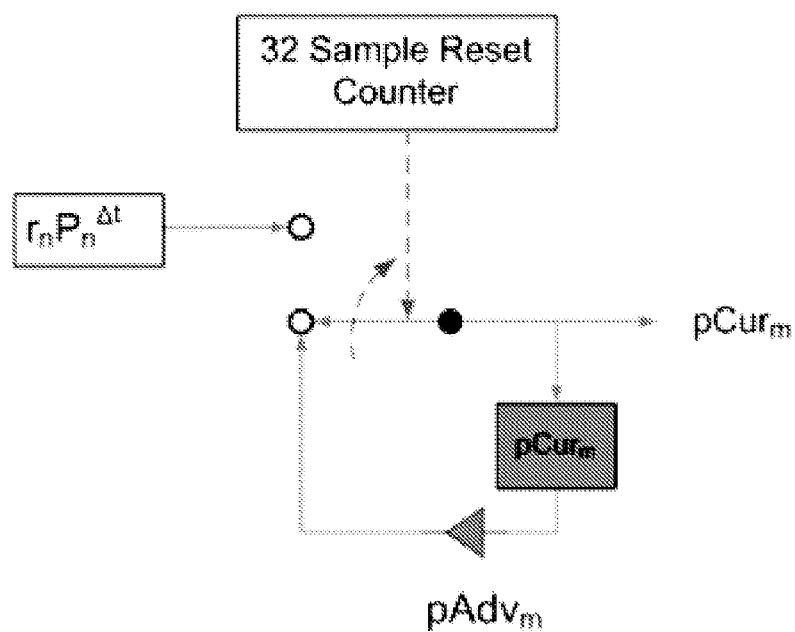
FIG. 12 is a high level block diagram illustrating a process for a single stride complex coefficient phasor advancing, according to various embodiments.

FIG. 12 is a high level block diagram illustrating a process 1200 for a single stride complex coefficient phasor advancing according to embodiments described above. The process 1200 may gradually accumulate error compared to the exact calculation of the complex exponential $P^{\Delta T}$. To compensate for this accumulation of error, the value of pCur may be reset to the exact value of $P^{\Delta T}$ every 32 samples using an implementation of a complex exponential. The number of samples between resets depends upon the desired accuracy requirements for the application, but 32 may be a good value for high quality.

Figure 13:
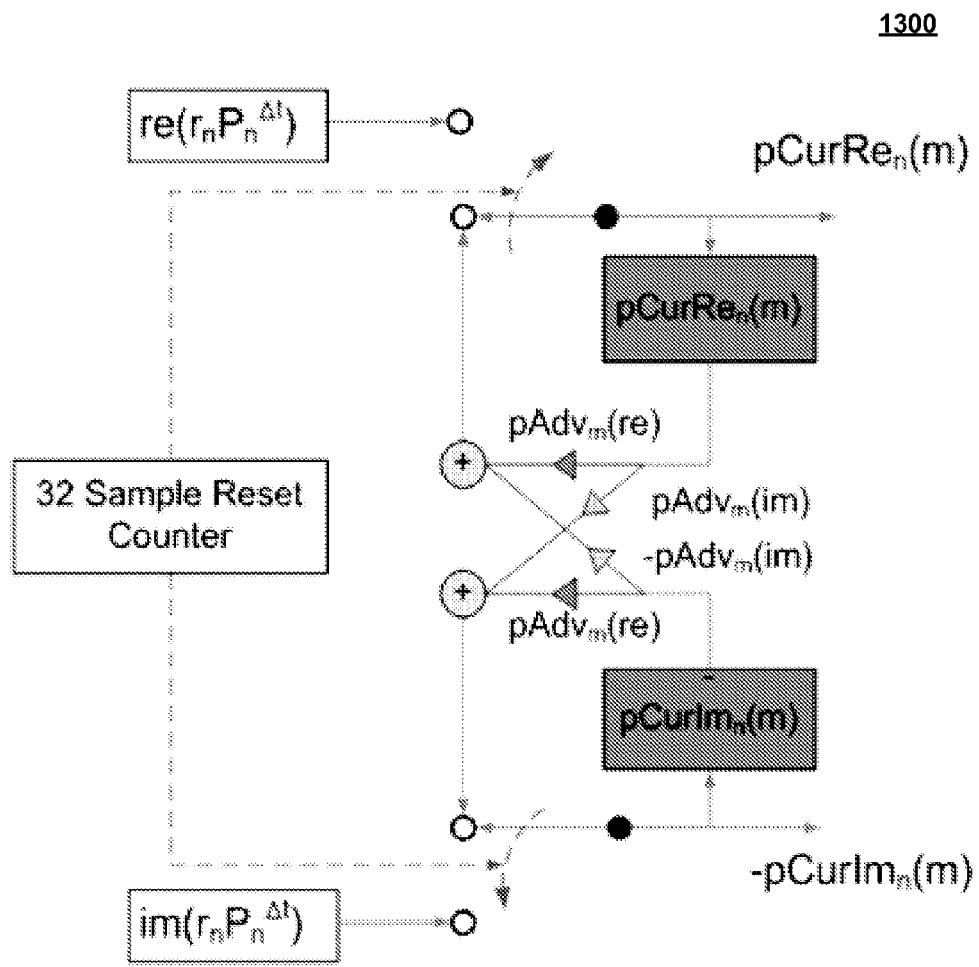
FIG. 13 is a high level block diagram illustrating a process for a single stride complex coefficient phasor advancing, which uses real arithmetic principles.

FIG. 13 is a high level block diagram illustrating a process 1300 for a single stride complex coefficient phasor advancing, which uses real arithmetic principles according to embodiments described above.

Stride Phasor Advance

According to one or more embodiments, the process of advancing a phasor vector by one sample may be generalized to a process of advancing the phasor by N samples. This process may be used to extend the number of samples computed within an acceptable error limit. A complex multiply by a phase advance may introduce about the same error whether the phase advance is one sample or k1 samples. Therefore, instead of re-computing the exact value using Eq. 34, $P^{\Delta T}$ can be computed by advancing a copy of the initial phasor by a "stride" phasor advance coefficient. This stride phasor advance is calculated using the following example principles.

The ratio of successive phasor values spaced apart by k samples may have only two values:

$$\frac{P^{\Delta T_1}}{P^{\Delta T_k}} = P^{frac(\Delta T_k - \Delta T_1)} = P^{frac(tInc*k)} \text{ or } P^{frac(tInc*k)-1} \quad (Eq. 39)$$

The quantity $\Delta T_k - \Delta T_1$ has two distinct values, which are frac(tInc*k) or frac(tInc*k)−1, where frac( ) is fractional part of tInc.

An example method for computing these factors may include:

$$pAdvStrideDown = P^{frac(tInc*k)}$$

$$pAdvStrideUp = P^{(frac(tInc*k)-1)} = P^{(frac(tInc*k)-1)} * P^{-1} \quad (Eq. 40)$$

The inverse of the pole coefficient may be denoted as $$nv = P^{-1} = \frac{1}{P},$$

where pInv may be pre-calculated from $P^{Fsf}$. Further, pInv may only need to be calculated when Fsf changes:

$$pAdvStrideUp = pAdvStrideDown * pInv \quad (Eq. 41)$$

Below is given an exemplary source code implementing the calculation of stride phasor advance coefficients:

```
% alphaWrap is used for N-stage stride phasor advance
alphaStrideWrap1 = 1−mod(K1*tInc, 1.0);
alphaStrideWrap2 = 1−mod(K2*K1*tInc, 1.0);
pAdvDown = ComplexExponential( Log2MagP, thetaP, tIncFrac );
% Calculate phasor advance for "wrap condition" when fractional alpha
% integrator wraps around
pAdvUp = pAdvDown .* pInv;
% Initialize coefficient phasor advance to unity
pAdv = ones(npoles, 1);
pAdvStride_1_Down =
ComplexExponential(Log2MagP, thetaP, mod((K1 * tIncFrac),1.0) );
pAdvStride_2_Down =
ComplexExponential(Log2MagP, thetaP, mod((K2 * K1 * tIncFrac),1.0) );
pAdvStride_1_Up = pAdvStride_1_Down .* pInv;
pAdvStride_2_Up = pAdvStride_2_Down .* pInv;
for outIdx=1:OutLen
    pCurPhasor = pCurPhasor .* pAdv;
    if indexY > length(x)
       break;
    end
% Reset phasor values to preserve accuracy
Stride_1_ResetIndex = Stride_1_ResetIndex+1;
if Stride_1_ResetIndex > K1
    if alphaSave1 >= alphaStrideWrap1
       pCurPhasor = pCurPhasorSave_1 .* pAdvStride_1_Up;
    else
       pCurPhasor = pCurPhasorSave_1 .* pAdvStride_1_Down;
    end
    pCurPhasorSave_1 = pCurPhasor;
    alphaSave1 = alpha;
    Stride_1_ResetIndex = 1;
end
Stride_2_ResetIndex = Stride_2_ResetIndex+1;
if Stride_2_ResetIndex > (K1*K2)
    if alphaSave2 >= alphaStrideWrap2
       pCurPhasor = pCurPhasorSave_2 .* pAdvStride_2_Up;
    else
       pCurPhasor = pCurPhasorSave_2 .* pAdvStride_2_Down;
    end
    pCurPhasorSave_2 = pCurPhasor;
    pCurPhasorSave_1 = pCurPhasor;
    alphaSave2 = alpha;
    Stride_2_ResetIndex = 1;
end
ResetIndex =ResetIndex+1;
% Exact recalculation of current phasor using complex exponential
if ResetIndex > (K1*K2*K3)
    pCurPhasor = rFixed.' .* ...
ComplexExponential(Log2MagP_Fsf, thetaP_Fsf, alpha );
    pCurPhasorSave_2 = pCurPhasor;
    pCurPhasorSave_1 = pCurPhasor;
    ResetIndex = 1;
end
% Real output only requires a_real*b_real − a_imag*b_imag
yOut(outIdx) = real(y(indexY, :) ) * real(pCurPhasor ) − imag(y(indexY,
:) ) * imag( pCurPhasor );
% Wrap subphase each time incrementing indexY.
% detect carry from fraction integrator first
alpha = alpha + tIncFrac;
alphaFrac = alpha − floor(alpha); % Fraction part of alpha
fracCarry = floor(alpha); % Integer part of alpha
indexY = indexY + fracCarry + tIncInt;
alpha = alphaFrac;
if fracCarry == 0
    pAdv = pAdvDown;
else
    pAdv = pAdvUp;
end
if indexY > length(x)
    break;
end
```

Figure 14:
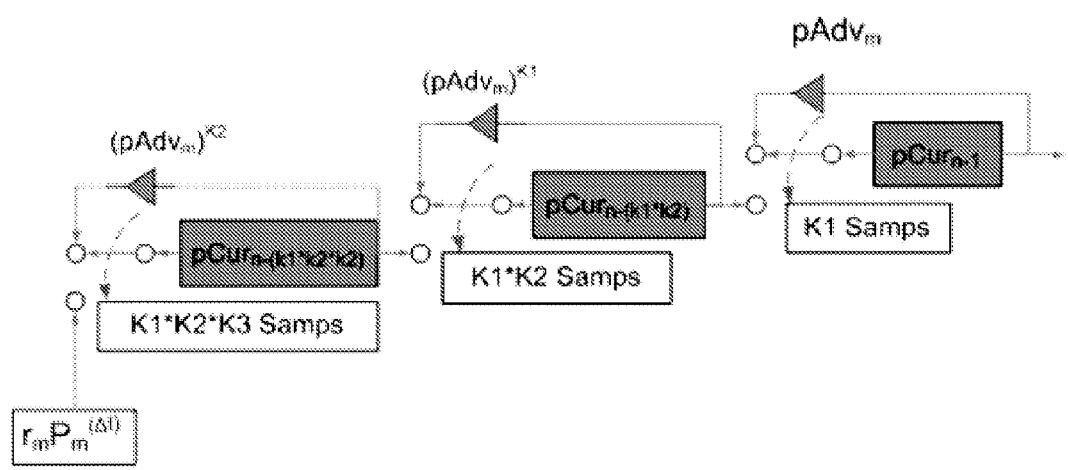
FIG. 14 is a high level block diagram of an example process for three stride phasor data resetting as used in the various embodiments.

FIG. 14 shows a high level block diagram of an example process 1400 for three stride phasor data resetting as used in the above embodiments. This figure shows the use of three sample sets K1, K2 and K3.

Figure 15:
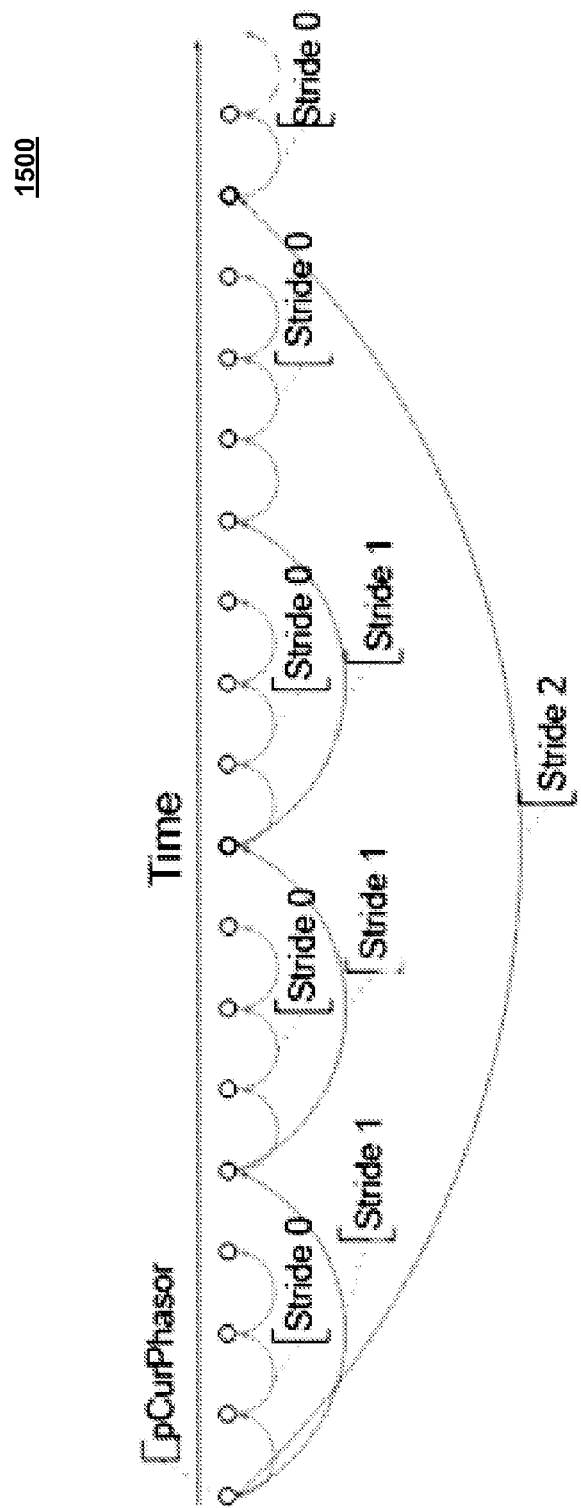
FIG. 15 is a simplified exemplary timeline for stride phasor advance.

FIG. 15 shows a simplified exemplary timeline 1500 for stride phasor advance. More specifically, there is shown the timeline 1500 that graphically represents updates from a starting value for pCur to the successive values either with stride 0, stride 1, or stride 2 phasor advance. The initial value of the current pole pCur is the first circle on the left, which is advanced one sample at a time (stride 0) by a complex multiply by pAdv. Further, at K1=4 samples (stride 1), the first sample is advanced by pAdvk1 to generate the 5th sample. Then at K2=16 samples (stride 2), the first sample is advanced by pAdvk2 to generate the 16th sample.

Optimized Form for IIR ASRC

The IIR ASRC method shown in FIG. 9 may use the residues commuted and combined with the output coefficients as described above. The residue scaling may now be absorbed into the output pCur scale factors. When the exact values for pCurPhasor are re-calculated, the residues may be multiplied by the residue coefficients using a complex multiplication:

$$p\text{CurPhasor} = r\text{Fixed}.'.* \ldots \text{ComplexExponential}(\text{Log2Mag}P\_Fsf, \text{theta}P\_Fsf, \text{alpha}) \quad (\text{Eq. 42})$$

Further, pCurPhasor may be advanced by pAdv or by the stride phasor advance factors, and there is no longer any need to separately apply the residue scale factors.

Figure 16:
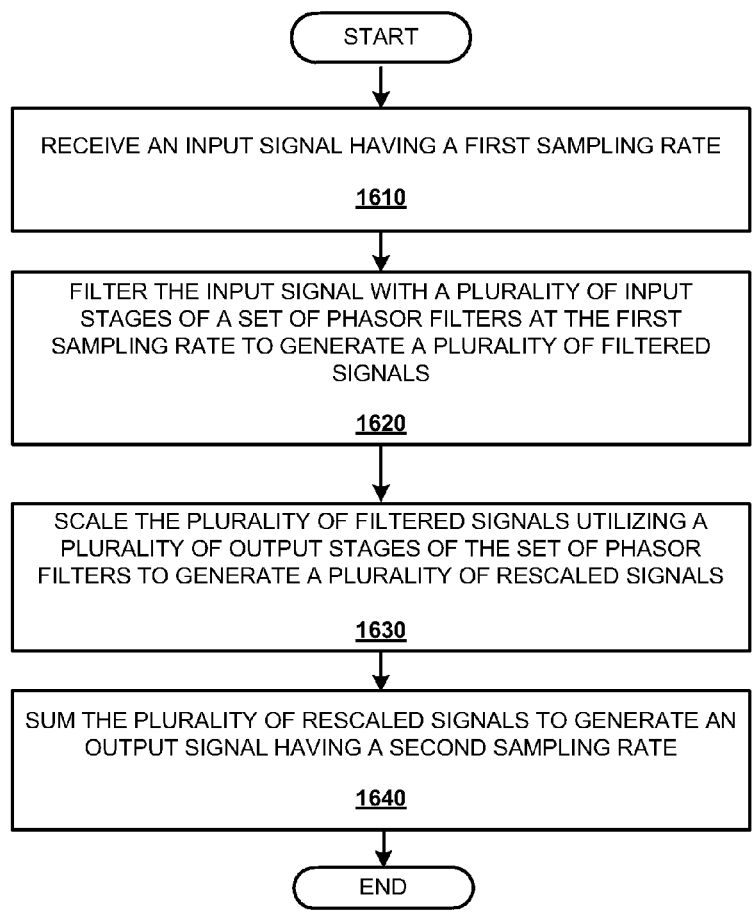
FIG. 16 is a high level flow chart showing an example method for asynchronous sampling rate conversion.

FIG. 16 is a high level flow chart showing a method 1600 for asynchronous sampling rate conversion, according to one or more embodiments of the present disclosure. The method may be practiced using the filter 900 and optionally additional details. Since the filter 900 provides digital signal processing, the method 1600 may be practically implemented using any suitable computing device, logic, processors, controllers, virtual modules, and so forth.

The method 1600 may commence at operation 1610 with the input stage of the filter 900 receiving an input signal, which has a first sampling rate. At operation 1620, the input stage of the filter 900 filters the input signal with a plurality of input stages of a set of phasor filters at the first sampling rate to generate a plurality of filtered signals. The filtering may additionally include calculation of filter coefficients, advancing, filter encoding, invariant mapping, and other techniques described herein.

At operation 1630, the output stage of the set of phasor filters of the filter 900 scales the plurality of filtered signals to generate a plurality of rescaled signals. Further, at operation 1640, the output stage of the set of phasor filters of the filter 900 sums the plurality of rescaled signals to generate an output signal having a second sampling rate, which differs from the first sampling rate.

The method 1600 may practically include additional operations or steps needed for ASRC. In an example embodiment, the following process (not shown) may be a particular implementation of the method 1600:

a) Initialize the coefficients for the prototype analog filter (see FIGS. 1, 2). These prototype analog filter coefficients can be pre-calculated once for a given desired quality specification.
b) Identify poles from top half of unit circle, including real poles. Discard conjugate poles, creating sparse set of analog pole coefficients. Scale remaining complex poles by 2 to compensate for discarded conjugate poles.
c) Perform impulse invariant mapping starting from original sparse analog S poles mapping to Z-Plane poles and residues.
d) Encode output stage coefficients in polar form for runtime exponentiation.
e) Perform initialization calculations for the case when tInc changes.
f) Filter input signal having a first sampling rate with input stage of the filter 900. Change input stage coefficients only when tInc changes. Store data from the input stage of filter 900 into temporary data buffer xHat.
g) Resample data buffer xHat using IndexY variable as the index into the input buffer table. When IndexY value does not change, the data value from buffer xHat remains the same. When IndexY increments by 1, then successive values from buffer xHat are retrieved. When IndexY increments by a value greater than 1, then values in the buffer xHat are skipped or decimated.
h) Advance the output stage phasor coefficients using pAdv phasor scale factors.
i) Scale data from temporary data buffer using output stage phasor advance pCur values.
j) Sum together all of the phasor values to compute an output signal having a second sampling rate.
k) Every 32 samples, reset pCur phasor advance factors using exact exponentiation algorithm.
l) Increment fraction and integer phase accumulators.
m) Select value for pAdv based on value of fracCarry from phase accumulator operations.
n) When using the stride reset mechanism, the pCur is advanced as described in the Stride Phasor Advance section.

Below is given an example embodiment in the form of a MATLAB source code to perform single stride reset (i.e., one sample phasor coefficient advance) according to the method 1600 as follows.

```
function [yOut, statesOut] = MaxSRC_Buf( x, tInc, statesIn )
% function [yOut, statesOut] = MaxSRC_Buf( x, tInc, statesIn )
% x: input buffer
% tInc: Input Sample Rate / Output Sample Rate; 2 means decimate by a
% factor of two, 0.5 means increase sample rate by a factor of two
% yOut: output buffer. Size of output buffer can be variable depending
% upon tInc value.
% statesIn & statesOut: state values to allow buffer by buffer processing
% This version of MaxSRC has 130 dB stop band, 0.01 dB pass band ripple,
% and transition band starts at Fs/2.4 (20 kHz at FsIn = 48 kHz).
% Fsf = frequency Scale Factor
% rescale poles for the cases where output is decimated in
% sample rate
if tInc > 1
    Fsf = 1/tInc;
else
    Fsf=1;
end
% Initialize coefficients for the prototype analog filter
% Phasor correction value: how many samples before reset to exact values of
% current output coefficient values
K1 = 32;
% Filter coefficients can be pre-calculated once for a given desired quality
% specification.
Apass = 0.01;           % Passband Ripple (dB)
Astop = 130;            % Stopband Attenuation (dB)
FilterOrder =15;
% s == s-plane poles
[zs,ps,ks]= ellipap(FilterOrder,Apass,Astop);
[bs, as] = zp2tf(zs,ps,ks);
[rs0, ps0, ks0] = residue(bs, as);
% Identify poles from top half of unit circle, including real poles.
% Discard conjugate poles, creating sparse set of analog pole coefficients.
% Scale remaining complex poles by 2 to compensate gain for discarded
% conjugate poles.
ps1=[ ]; rs1=[ ];
idx=1;
```

-continued

```
for kk=1:length(ps0)
    if imag(ps0(kk))<=0
        ps1(idx) = ps0(kk);
        rs1(idx) = rs0(kk);
        if ~isreal(ps1(idx))
            rs1(idx) = rs1(idx) * 2;
        end
        idx = idx+1;
    end
end
ps1 = ps1(:);
npoles = length( ps1 ); % update the number of analog poles
% Perform impulse invariant mapping
% starting from original sparse analog S poles
% mapping to Z-Plane poles & residues
Fs = 48000;
Tn = pi*20000/(Fs/2); %
ps1 = exp( Tn*ps1 );
rs1 = rs1*Tn;
npoles = length(ps1);
% Initialize states
if nargin < 3
    statesIn.FiltStates = zeros(1, npoles);
    statesIn.deltaT = 0;
    statesIn.indexY = 1;
    statesIn.pCur = ones(npoles, 1); % initialize coefficient phasor
    statesIn.pAdv = ones(npoles, 1); % initialize coefficient phasor
    advance
    statesIn.ResetIndex = 1;
end
FiltStates = statesIn.FiltStates;
deltaT = statesIn.deltaT;
indexY = statesIn.indexY;
ResetIndex = statesIn.ResetIndex;
pCur = statesIn.pCur;
pAdv = statesIn.pAdv;
% Allocate memory
xHat = zeros(length(x),npoles);
yOut = zeros(1, ceil(length(x)*(1/tInc)))';
OutLen = length(yOut);
% Encode output coefs in log polar form for run time exponentiation
Log2MagP = log2(abs(ps1));
thetaP = angle(ps1);
% tInc Rate Calculations
% Residues get scaled by Fsf
rFixed = rs1 .* Fsf;
pCur = pCur .* rFixed.';
% pFixed = ComplexExponential( Log2MagP, thetaP, Fsf );
Log2MagP_Fsf = Log2MagP * Fsf;
thetaP_Fsf = thetaP * Fsf;
% Inverse of pole coefficients pInv can be calculated when tInc changes.
% Compute SIN & COS once, then use CONJUGATE to calculate pInv.
% Share SIN & COS with calculation of pFixed poles coefficients.
pCos = cos( thetaP_Fsf );
pSin = sin( thetaP_Fsf );
pInvMag = (2 .^ (-Log2MagP_Fsf));
pFixed = (2 .^ (Log2MagP_Fsf)) .* (pCos + i*pSin);
pInv = pInvMag .* (pCos - i*pSin);
tIncFrac = tInc - floor(tInc); % Fraction part of tInc
tIncInt = tInc - tIncFrac; % Integer part of tInc
% Calculate phasor advance up and down only when tInc changes
pAdvDown = ComplexExponential( Log2MagP_Fsf, thetaP_Fsf, tIncFrac );
% Calculate phasor advance for "wrap condition" when fractional deltaT
% integrator wraps around
pAdvUp = pAdvDown .* pInv;
% END of tInc Rate Calculations
% Calculate input stage filter at input sample rate. Change pFixed
% coefficients when tInc changes.
for m=1:npoles
    [xHat(:,m), FiltStates(m)] = filter(1, [1 -pFixed(m)],
        x, FiltStates(m));
end
% Output stage time-varying filter
for outIdx=1:OutLen
    % Pole coefficient phasor advance
    pCur = pCur .* pAdv;
    if indexY > length(x)
        break;
    end
% Real output only requires a_real*b_real - a_imag*b_imag
    yOut(outIdx) = real(xHat(indexY, :))*real(pCur) - ...
        imag(xHat(indexY, :))*imag(pCur);
    % reset phasors to exact value when required
    if ResetPhasorsFlag == true
        % count output tics
        if mod(ResetIndex, K1) == 0
            pCur = rFixed.' .* ComplexExponential-
                (Log2MagP_Fsf, thetaP_Fsf, deltaT );
            ResetIndex = ResetIndex - K1+1;
        end
        ResetIndex =ResetIndex+1;
    end
% Wrap subphase each time incrementing indexY.
% detect carry from fraction integrator first
    deltaT = deltaT + tIncFrac;
    deltaTFrac = deltaT - floor(deltaT); % Fraction part of deltaT
    fracCarry = deltaT - deltaTFrac; % Integer part of deltaT
    indexY = indexY + fracCarry + tIncInt;
    deltaT = deltaTFrac;
    if fracCarry == 0
        pAdv = pAdvDown;
    else
        pAdv = pAdvUp;
    end
    if indexY > length(x)
        break;
    end
end
% NOTE! Output buffer is not always the same length in this scheme
if outIdx < OutLen
    yOut = yOut(1:outIdx);
end
% Save states out to the world
statesOut.FiltStates = FiltStates;
statesOut.indexY = indexY - length(x);
if (statesOut.indexY < 1.0)
    statesOut.indexY = 1.0;
end
statesOut.deltaT = deltaT;
statesOut.pCur = pCur;
statesOut.pAdv = pAdv;
statesOut.ResetIndex = ResetIndex;
function pApprox = ComplexExponential( Log2MagP, theta, deltaT )
pApprox = 2 .^ (Log2MagP .* deltaT) .*
    (cos(theta*deltaT) + i*sin( theta*deltaT ));
```

Combining IIR ASRC with Halfband Stages (Multi-Stage SRC)

Figure 17:
FIG. 17 is a high level block diagram of an example IIR ASRC multistage system for increasing the output sampling rate.

According to one or more embodiments of the present disclosure, the IIR ASRC real phasor filter 900 may additionally include or be combined with halfband filters using, for example, all pass polyphase decomposition. In certain embodiments, when the output sampling rate is more than twice the input sampling rate, it is possible to perform the method 1600 using the IIR ASRC real phasor filter 900 at the low rate, and further use one or more IIR halfband interpolators to increase to the output sampling rate to a higher rate. FIG. 17 shows a high level block diagram of an example IIR ASRC multistage system 1700 for increasing the output sampling rate. As shown in this figure, there are used two IIR halfband interpolators 1710, 1720 operatively coupled to the output of the IIR ASRC real phasor filter 900. Each of the interpolators 1710, 1720 may double the output sampling rate.

Similarly, in the cases where the output sample rate is more than half of the required input sampling rate, the input sampling rate may be decimated by one or more halfbands, and then the IIR ASRC method can be performed at the lower rate.

Figure 18:
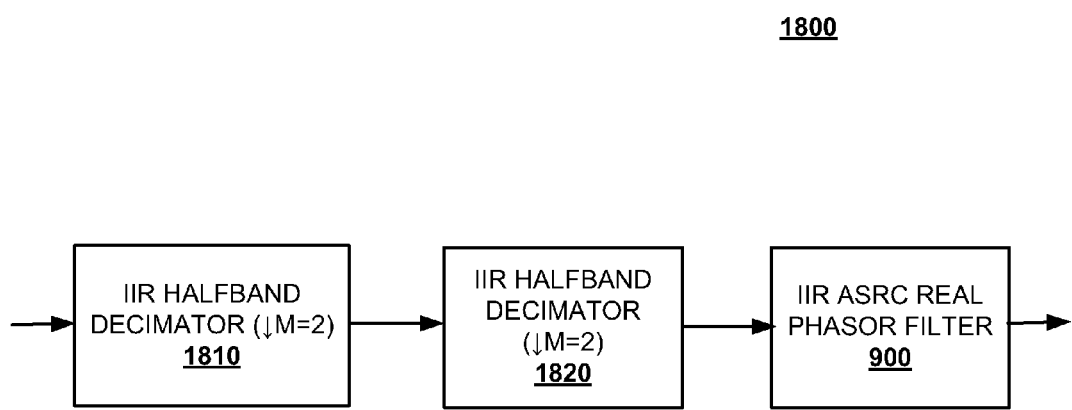
FIG. 18 is a high level block diagram of an example IIR ASRC multistage system for decreasing the input sampling rate.
Figure 19:
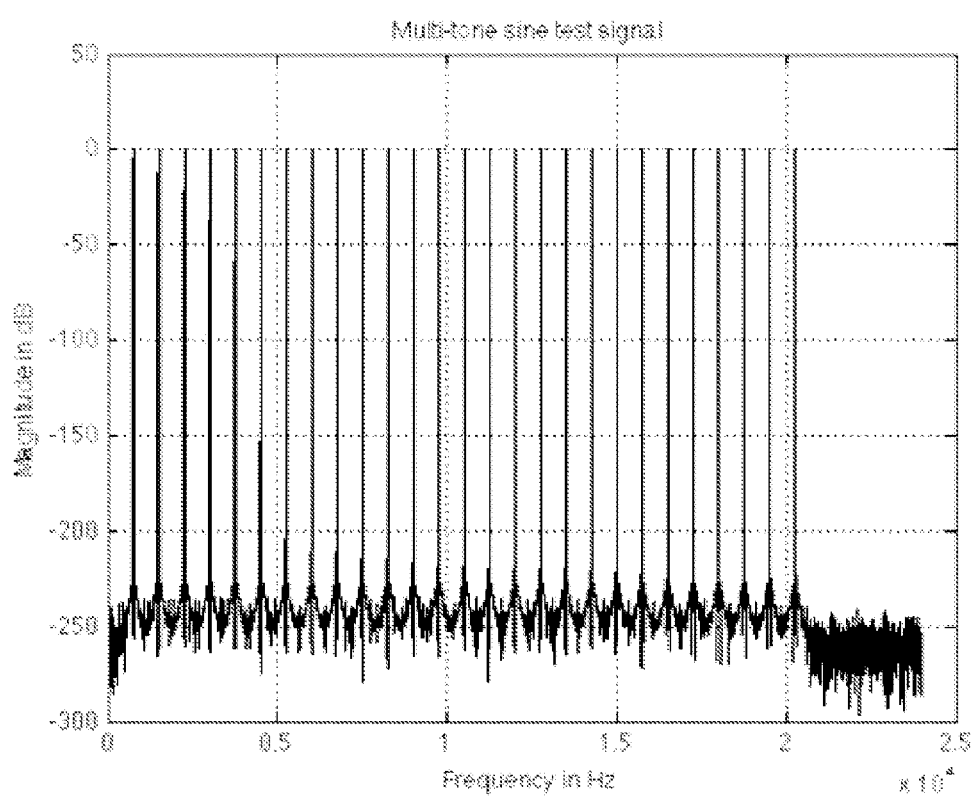
FIGS. 19-27 illustrate exemplary plots depicting the test of a prototype multi-tone IIR ASRC filter using seven complex poles and one real pole.
Figure 20:
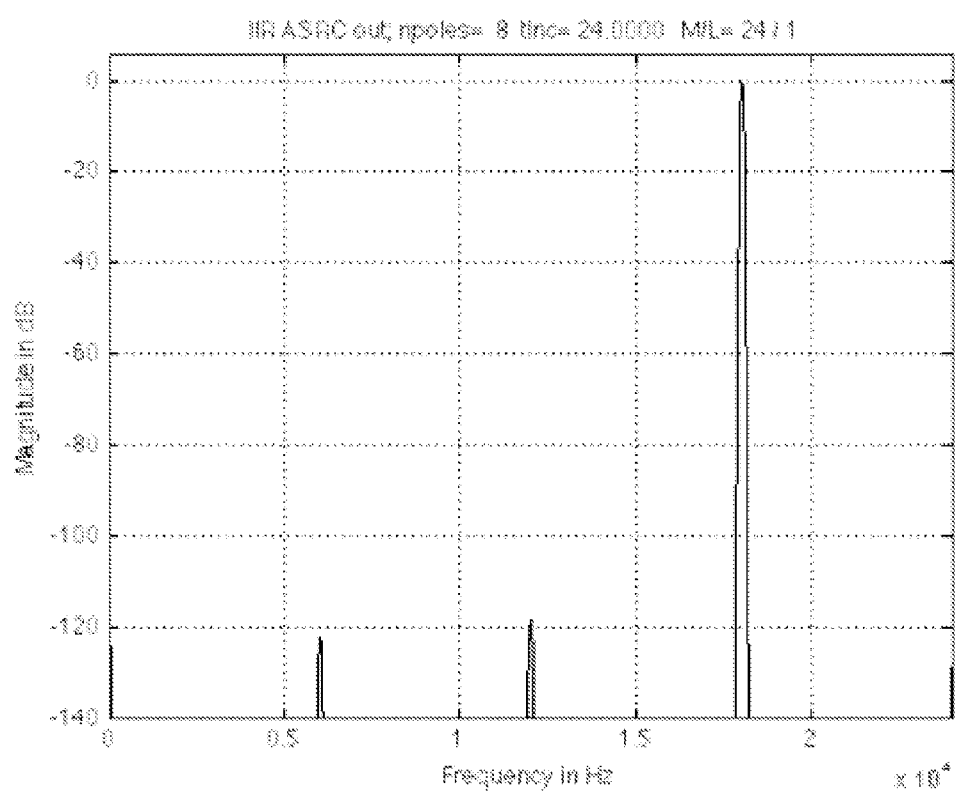
Figure 21:
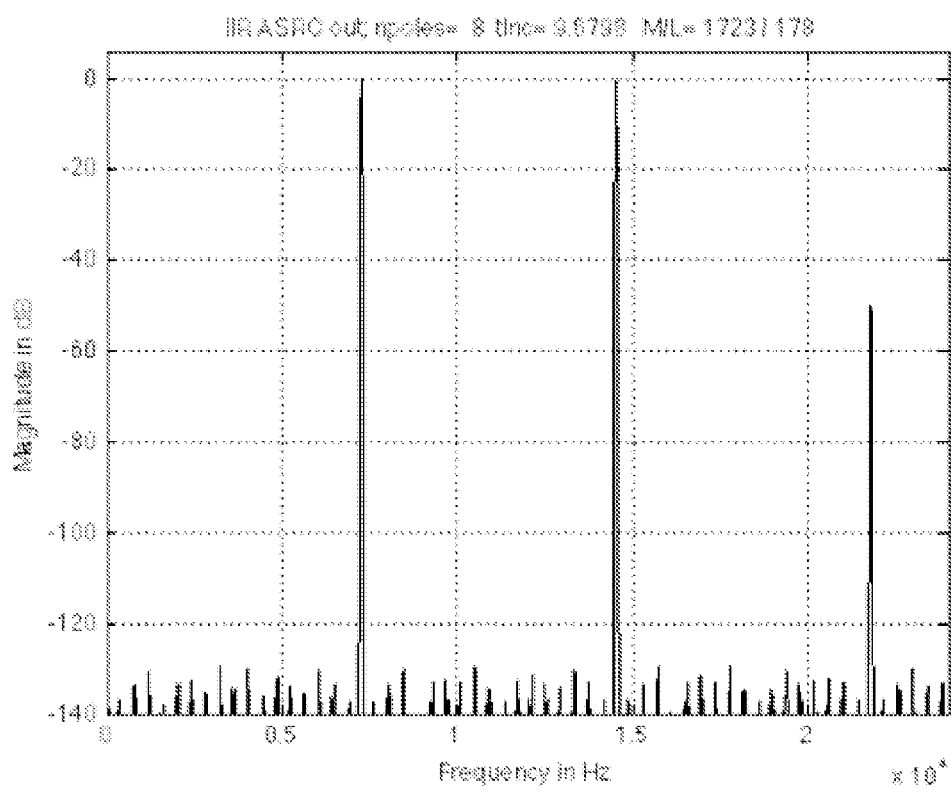
Figure 22:
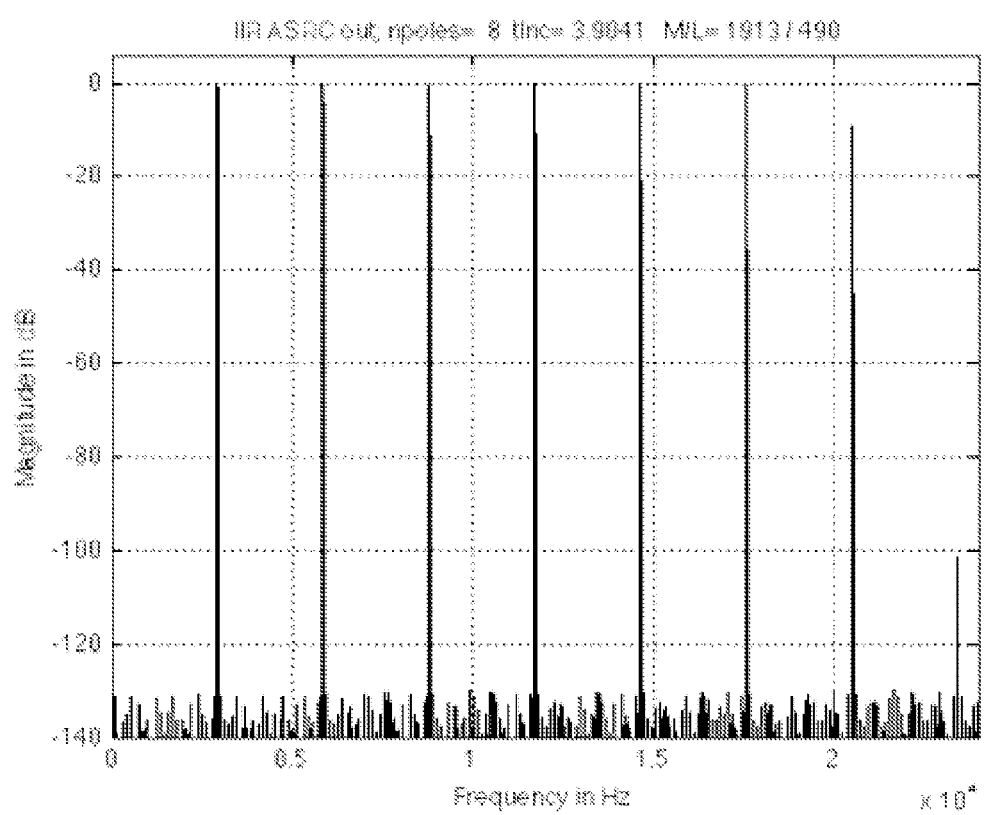
Figure 23:
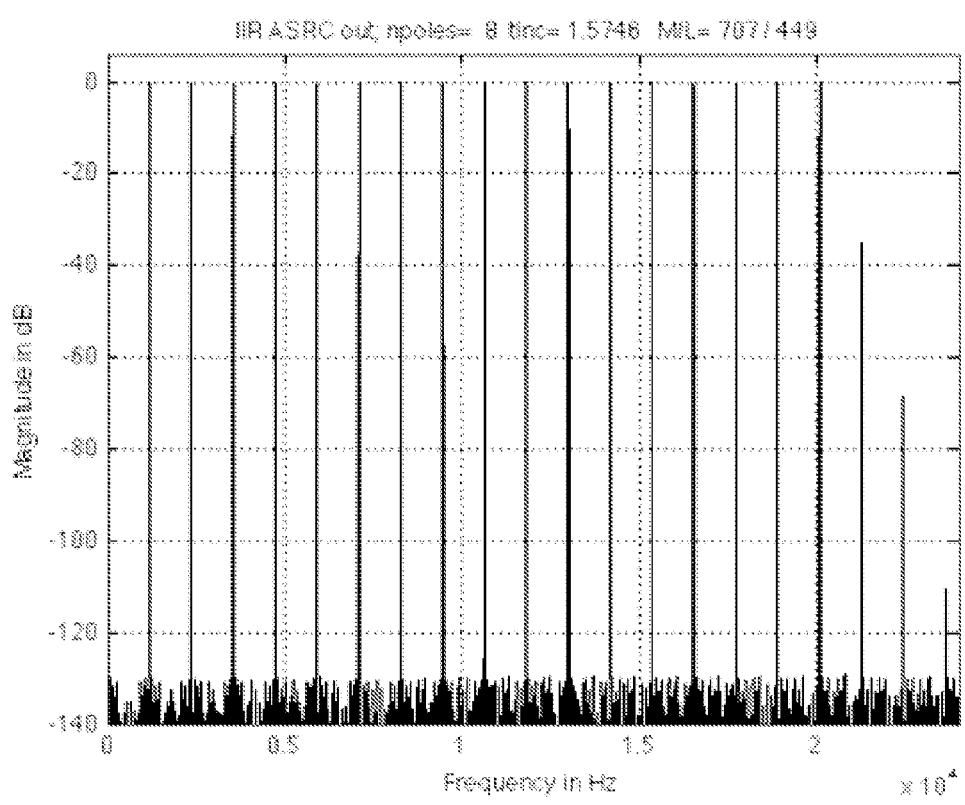
Figure 24:
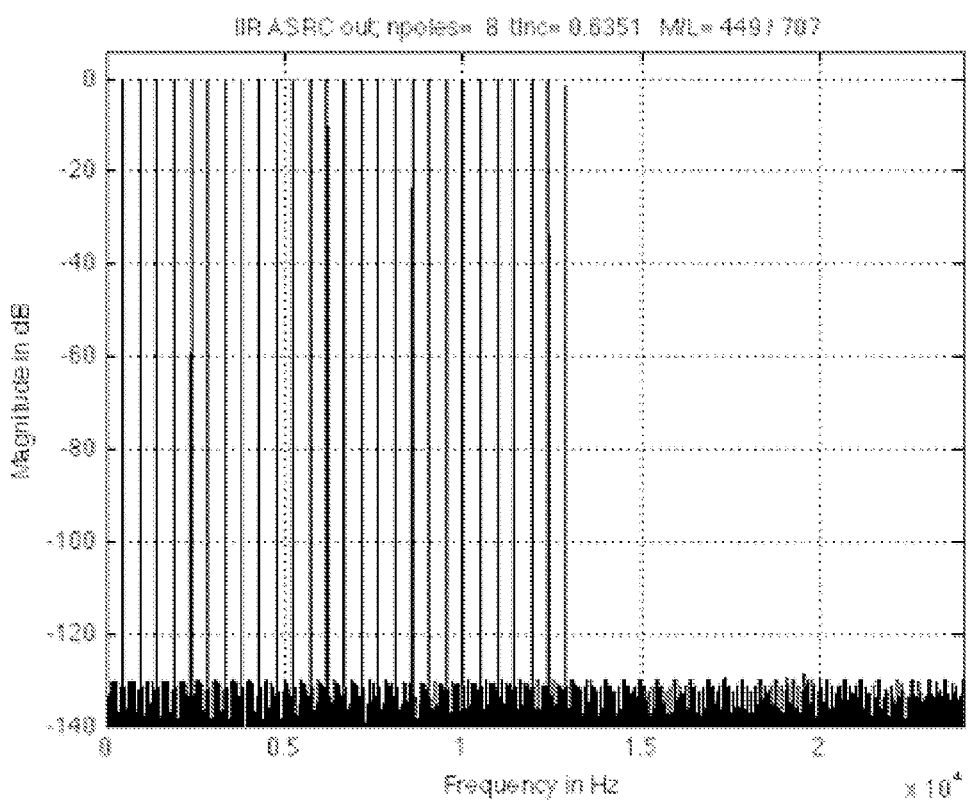
Figure 25:
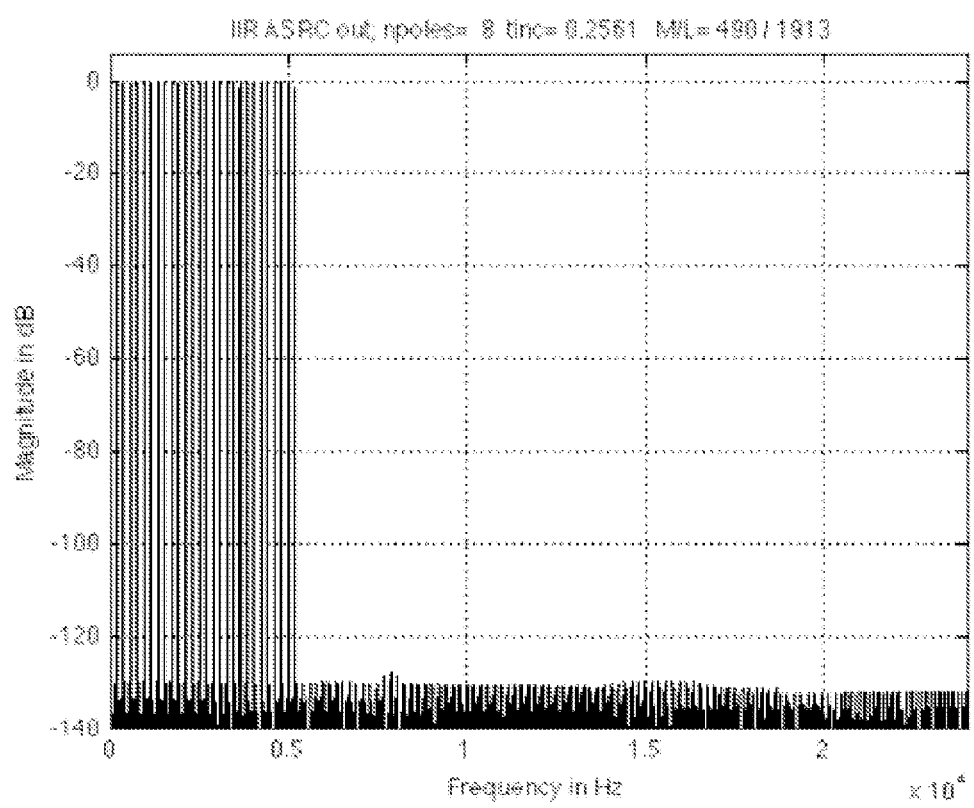
Figure 26:
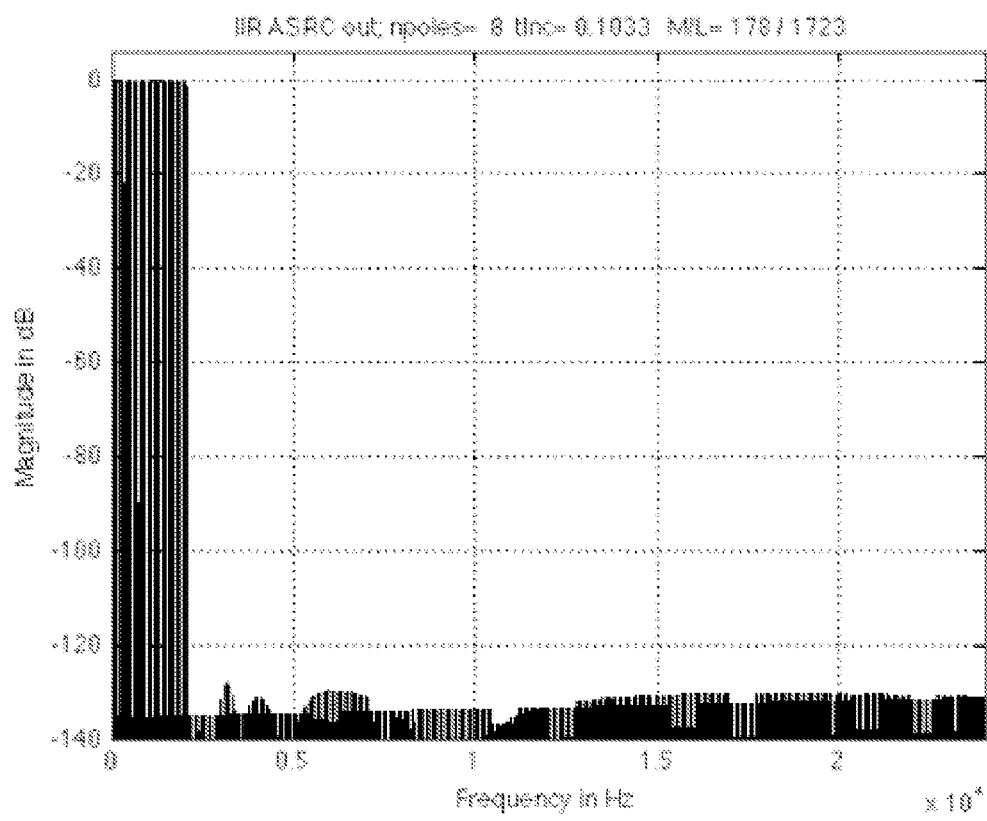
Figure 27:
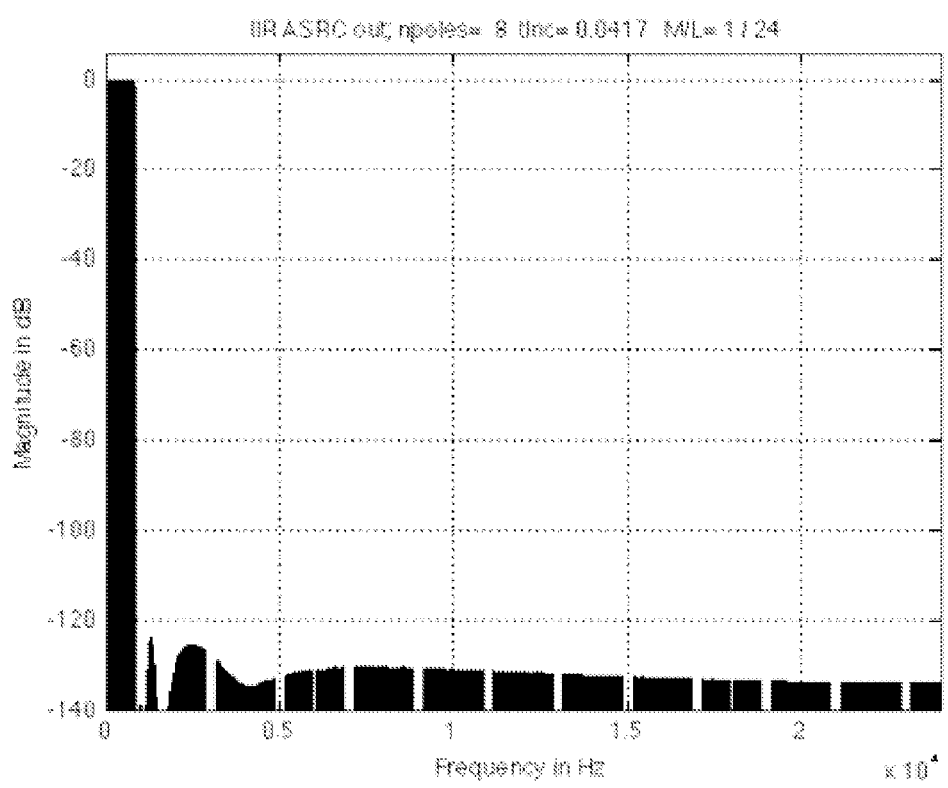

FIG. 18 shows a high level block diagram of an example IIR ASRC multistage system 1800 for decreasing the input sampling rate. As shown in this figure, there are used two IIR halfband decimators 1810, 1820 operatively coupled to the input of the IIR ASRC real phasor filter 900. Each of the decimators 1810, 1820 may decrease the input sampling rate in two times.

In further embodiments, it is also possible to use an upsampler to increase the width of the transition band, and then to use a lower order IIR filter for the ASRC operation. This option may be practical in some cases, including the case where an input sampling rate is slightly different from the output sampling rate.

Test Results for IIR ASRC

FIGS. 19-27 illustrate exemplary plots 1900, 2000, 2100, 2200, 2300, 2400, 2500, 2600 and 2700, respectively, illustrating the test of a prototype multi-tone IIR ASRC filter using seven complex poles and one real pole, with coefficients quantized to single precision IEEE Floats standard. The prototype filter has a 130 dB stop band and a transition band from 20 to 24 kHz (transition bandwidth was Fs/12). The aliases average around 125 to 135 dB down from full scale.

Figure 28:
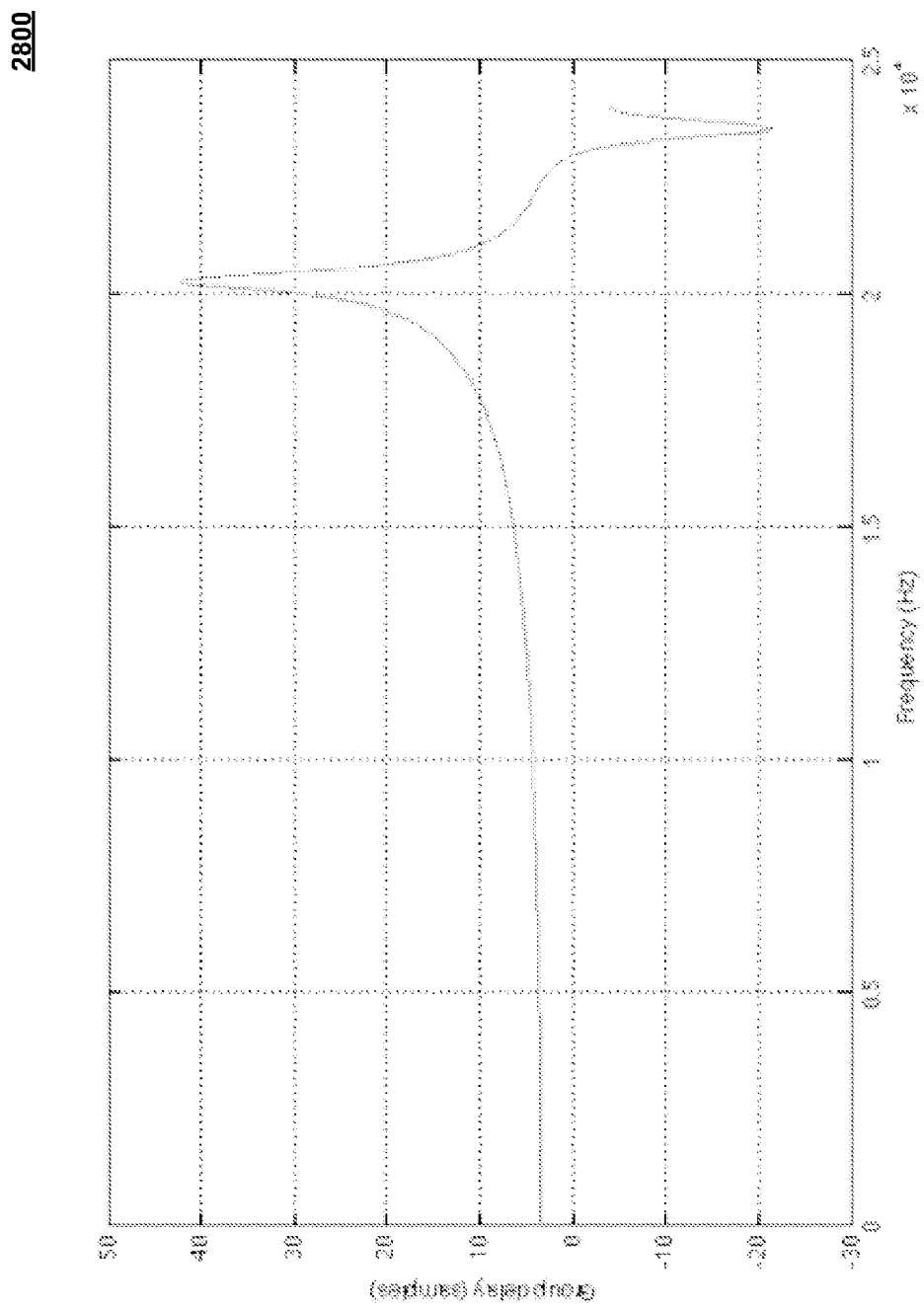
FIG. 28 is a plot illustrating a group delay for IIR ASRC filter.

FIG. 28 is a plot 2800 illustrating a group delay for a 15th order for the IIR ASRC filter 900, when tInc=1.0.

Figure 29:
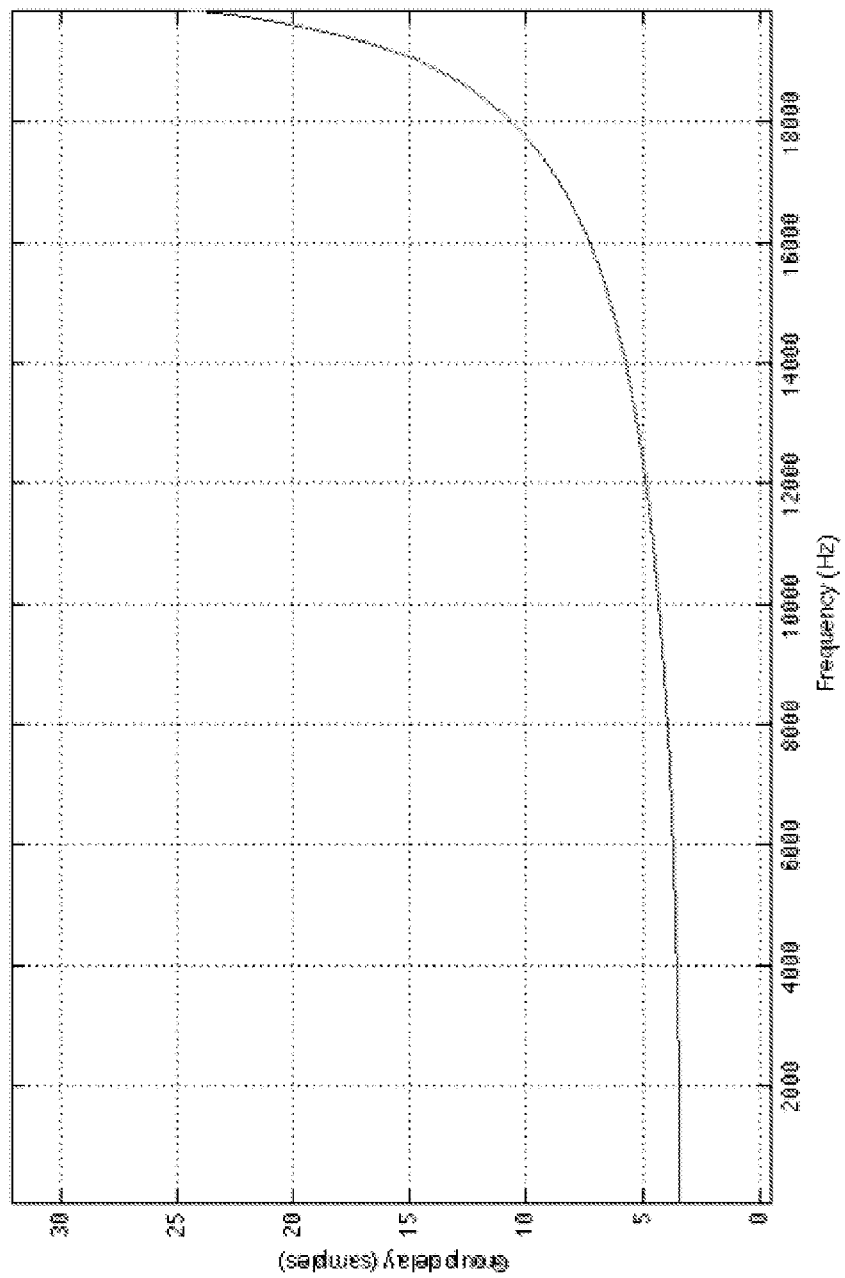
FIG. 29 is a zoomed central section of FIG. 28.

FIG. 29 is a zoomed central section of FIG. 28. As shown in this figure, the overall latency (i.e., a peak of envelope of impulse response) is about 5 samples.

Figure 30:
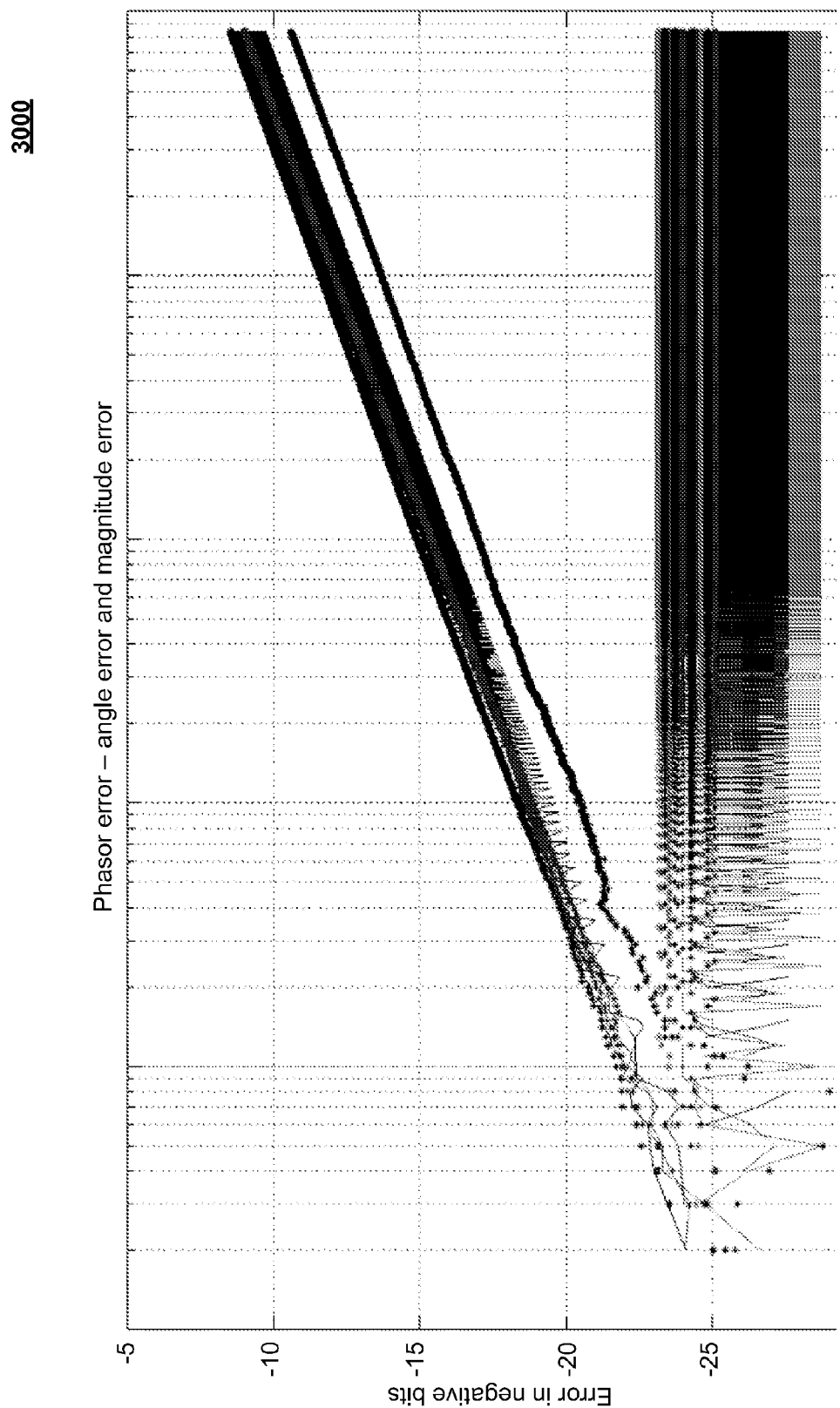
FIG. 30 is an example coefficient phasor advance error accumulation log plot.

FIG. 30 is an example coefficient phasor advance error accumulation log plot 3000 (32 sample resent count used).

Figure 31:
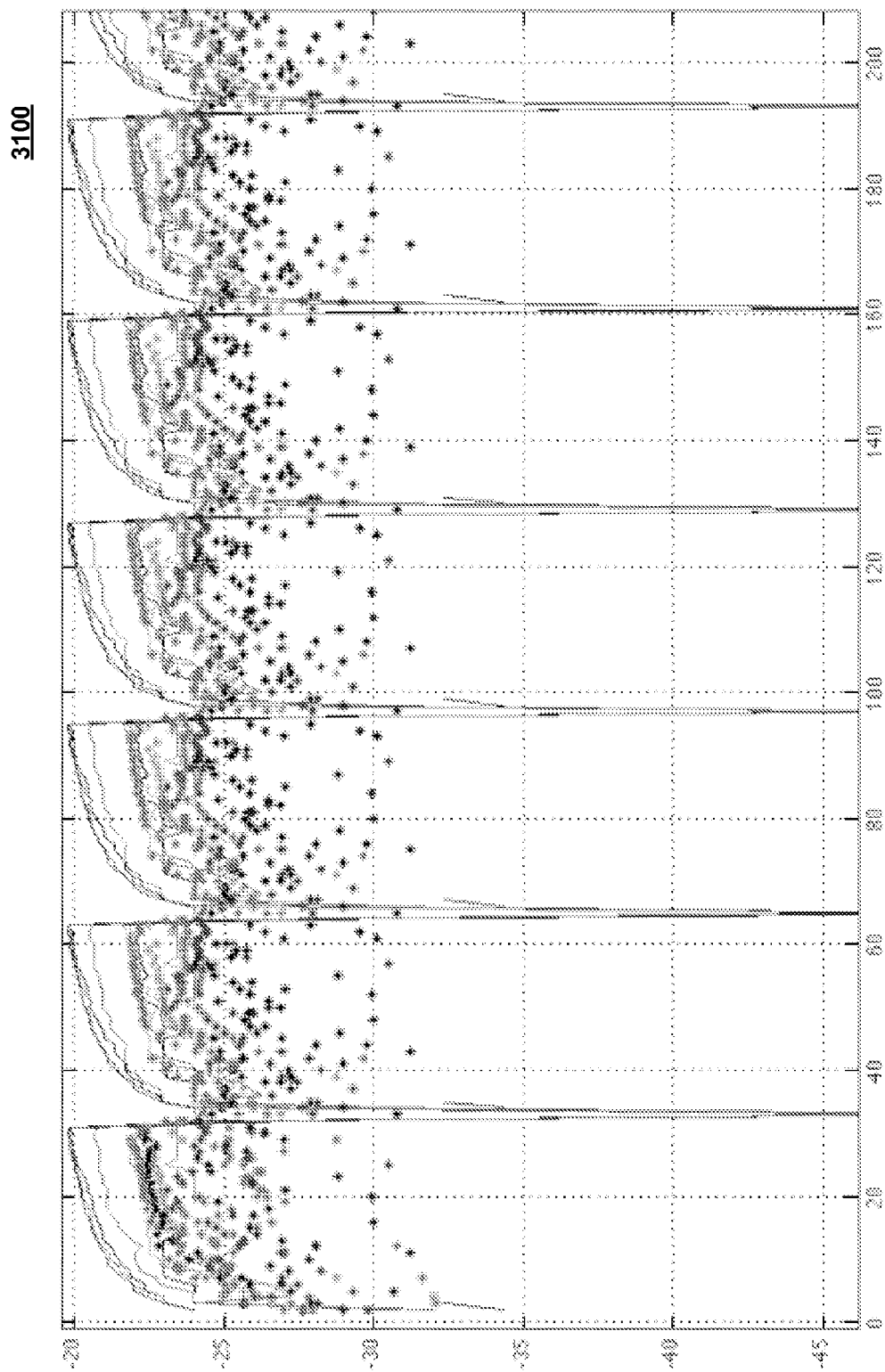
FIG. 31 is an example coefficient phasor advance error accumulation linear plot.

FIG. 31 is an example coefficient phasor advance error accumulation linear plot 3100 (corresponds to the same test given in FIG. 30). Asterisks refer to angle errors, while lines refer to magnitude errors.

Figure 32:
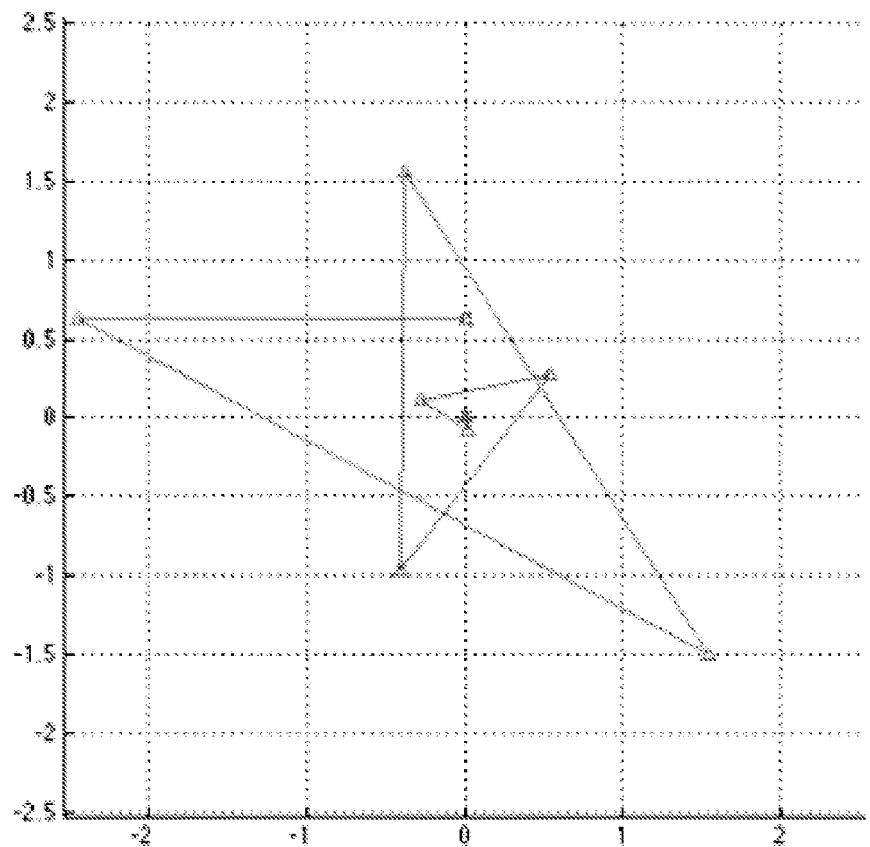
FIG. 32 is an example plot representing a vector addition of eight phasor vectors for a first sample of the impulse response of IIR ASRC method shown in FIG. 16.

FIG. 32 is an example plot 3200 representing vector addition of 8 phasor vectors for the first sample of the impulse response of the IIR ASRC method 1600. Each phasor is represented as a vector. Phasor addition can be shown as vector addition, by putting the start of each successive vector at the endpoint of the previous vector.

Figure 33:
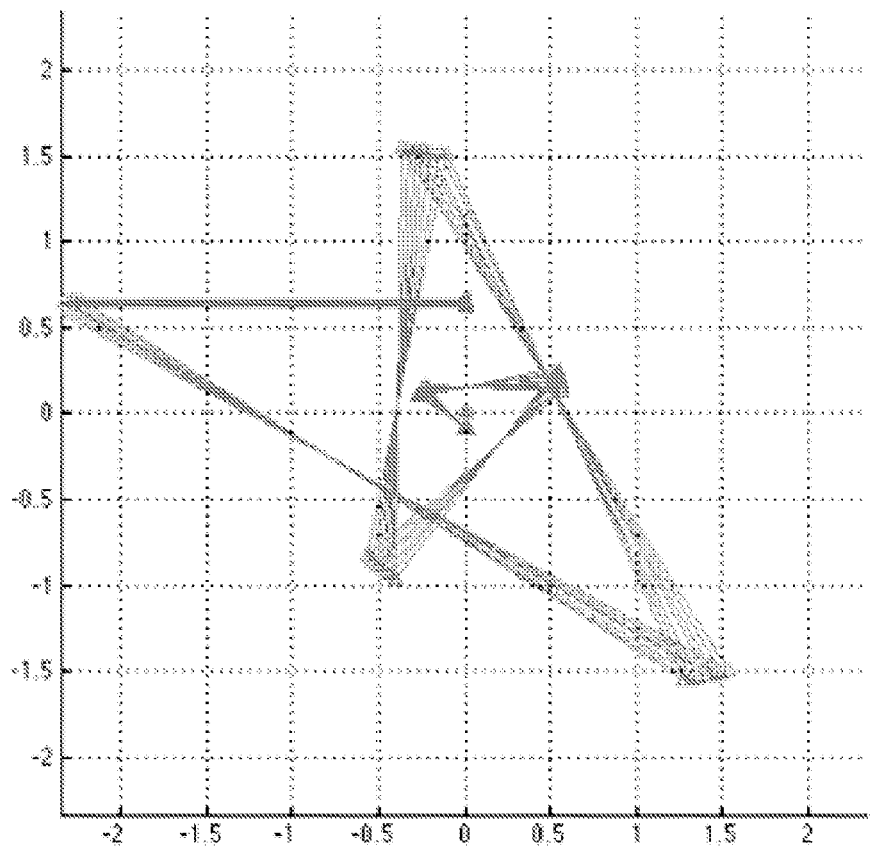
FIG. 33 shows seven successive phasor vector addition plots for the first seven output samples of the impulse response of the IIR ASRC method illustrated in FIG. 16.

FIG. 33 shows seven successive phasor vector addition plots for the first seven output samples of the impulse response of the method 1600.

Example Computer System

Figure 34:
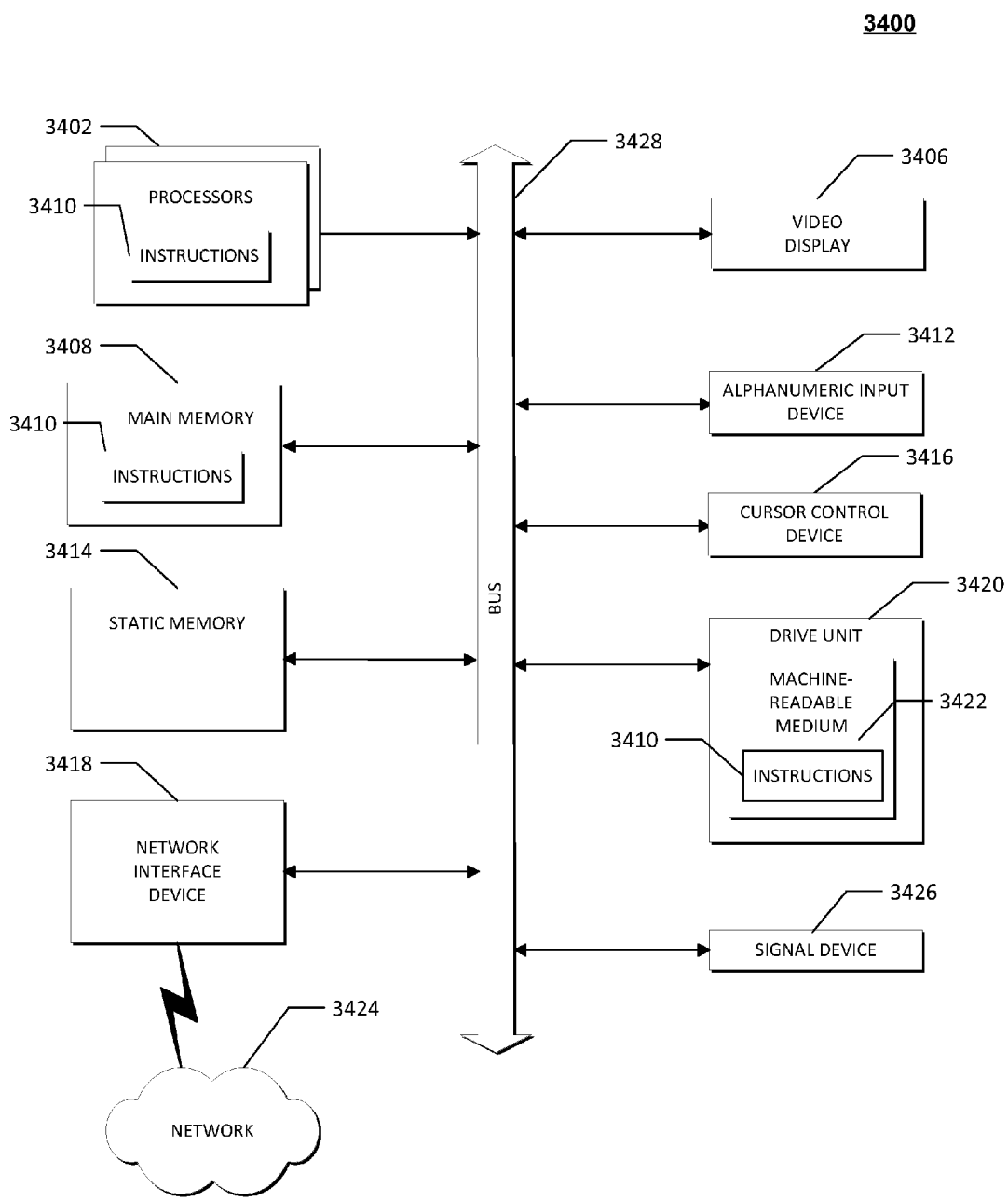
FIG. 34 is a diagrammatic representation of an example machine in the form of a computer system, within which a set of instructions for causing the machine to perform any one or more of the methodologies discussed herein may be executed.

FIG. 34 is a diagrammatic representation of an example machine in the form of a computer system 3400, within which a set of instructions for causing the machine to perform any one or more of the methodologies discussed herein may be executed.

In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a PC, a tablet PC, a phablet PC, a set-top box (STB), a personal digital assistant (PDA), a cellular telephone, a portable music player (e.g., a portable hard drive audio device such as an Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 3400 includes a processor or multiple processors 3402 (e.g., a central processing unit (CPU), a graphics processing unit (GPU), or both), and a main memory 3408 and static memory 3414, which communicate with each other via a bus 3428. The computer system 3400 may further include a video display unit 3406 (e.g., a liquid crystal display (LCD), touchscreen and the like). The computer system 3400 may also include an alphanumeric input device 3412 (e.g., physical and/or virtual keyboard, keypad, and the like), a cursor control device 3416 (e.g., a mouse, touchpad, touchscreen and the like), a voice recognition or biometric verification unit (not shown), a disk drive unit 3420, a signal device or devices 3426 (e.g., a speaker, one or more microphones, and the like), and a wired and/or wireless network interface device 3418 (e.g., network interface adapter, modem, radio, antenna, and the like). The computer system 3400 may further include a data encryption module (not shown) to encrypt data.

The disk drive unit 3420 includes a computer-readable medium 3422 on which is stored one or more sets of instructions and data structures (e.g., instructions 3410) embodying or utilizing any one or more of the methodologies or functions described herein. The instructions 3410 may also reside, completely or at least partially, within the main memory 3408 and/or within the processors 3402 during execution thereof by the computer system 3400. The main memory 3408 and the processors 3402 may also constitute machine-readable media. The instructions 3410 may further be transmitted or received over a wired and/or wireless network 3424 via the network interface device 3418. While the computer-readable medium 3422 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media. Such media may also include, without limitation, hard disks, floppy disks, flash memory cards, digital video disks, random access memory (RAM), read only memory (ROM), and the like.

While the present embodiments have been described in connection with a series of embodiments, these descriptions are not intended to limit the scope of the subject matter to the particular forms set forth herein. It will be further understood that the methods are not necessarily limited to the discrete components described. To the contrary, the present descriptions are intended to cover such alternatives, modifications, and equivalents as may be included within the spirit and scope of the subject matter as disclosed herein and defined by the appended claims and otherwise appreciated by one of ordinary skill in the art.

What is claimed is:

1. A method for asynchronous sampling rate converting, the method comprising:
   receiving, by one or more processors, an input signal, the input signal having a first sampling rate;
   filtering, by the one or more processors, the input signal with a plurality of input stages of a set of phasor filters at the first sampling rate to generate a plurality of filtered signals;

scaling, by the one or more processors, the plurality of filtered signals utilizing a plurality of output stages of the set of phasor filters to generate a plurality of rescaled signals; and summing, by the one or more processors, the plurality of rescaled signals to generate an output signal having a second sampling rate, wherein the second sampling rate differs from the first sampling rate, wherein the plurality of filtered signals includes a set of complex values; and wherein the plurality of rescaled signals includes a set of real values.

2. The method of claim 1, further comprising temporary storing, by the one or more processors, the plurality of filtered signals in a data buffer.

3. The method of claim 2, further comprising re-sampling, by the one or more processors, the plurality of filtered signals.

4. The method of claim 1, wherein the second sampling rate is associated with an arbitrary sequence of sampling time instances.

5. The method of claim 1, further comprising calculating, by the one or more processors, phasor filter coefficients based at least in part on the second sampling rate.

6. The method of claim 5, further comprising encoding, by the one or more processors, the phasor filter coefficients using one or more log domain operations.

7. The method of claim 5, further comprising advancing, by the one or more processors, the phasor filter coefficients utilizing at least one approximating or extrapolating function.

8. The method of claim 5, further comprising:
determining, by the one or more processors, that the second sampling rate is lower than the first sampling rate; and
based on the determination, re-scaling, by the one or more processors, the phasor filter coefficients so as to dynamically reduce a cut-off frequency of the set of phasor filters.

9. The method of claim 1, wherein the set of phasor filters comprise a set of Infinite Impulse Response (IIR) filters.

10. A system for asynchronous sampling rate converting, the system comprising:
a set of phasor filters, each phasor filter including an input stage and an output stage, the input stages of the set of phasor filters being configured to:
receive an input signal, the input signal having a first sampling rate; and
filter the input signal at the first sampling rate to generate a plurality of filtered signals; and
the output stages of the set of phasor filters being configured to:
a) scale the plurality of filtered signals to generate a plurality of rescaled signals; and
b) sum the plurality of rescaled signals to generate an output signal having a second sampling rate, wherein the second sampling rate differs from the first sampling rate; and
a data buffer configured to temporarily store the plurality of filtered signals.

11. The system of claim 10, wherein the input stage of at least one phasor filter includes a single complex pole filter.

12. The system of claim 10, wherein one of the input stage phasor filters includes a first order recursive filter.

13. The system of claim 10, wherein the plurality of filtered signals includes a set of residues generated by the plurality of input stages of the set of phasor filters.

14. The system of claim 10, wherein the output stages of the set of phasor filters include at least one phase accumulator.

15. The system of claim 10, further comprising one or more half band interpolators configured to increase a sampling rate of the output signals.

16. The system of claim 10, further comprising one or more half band decimators configured to decrease a sampling rate of the input signals.

17. The system of claim 10, wherein the output stages are configured to rescale one or more phasor coefficients used in the filtering of the input signal.

18. The system of claim 10, further comprising a processing unit configured to advance phasor filter coefficients utilizing at least one approximating or extrapolating function.

19. The system of claim 10, wherein the phasor filters comprise Infinite Impulse Response (IIR) filters.

20. A non-transitory processor-readable medium having embodied thereon a program being executable by at least one processor to perform a method for asynchronous sampling rate converting, the method comprising:
receiving an input signal, the input signal having a first sampling rate;
filtering the input signal with a plurality of input stages of a set of phasor filters at the first sampling rate to generate a plurality of filtered signals;
scaling the plurality of filtered signals utilizing a plurality of output stages of the set of phasor filters to generate a plurality of rescaled signals; and
summing the plurality of rescaled signals to generate an output signal having a second sampling rate, wherein the second sampling rate differs from the first sampling rate, wherein the plurality of filtered signals includes a set of complex values; and wherein the plurality of rescaled signals includes a set of real values.

\* \* \* \* \*